United States Patent
Oyamada et al.

(10) Patent No.: US 9,502,657 B2
(45) Date of Patent: Nov. 22, 2016

(54) ORGANIC ELECTROLUMINESCENCE DEVICE AND MANUFACTURING METHOD THEREOF

(75) Inventors: Takahito Oyamada, Kawasaki (JP); Naoya Yuzuriha, Fukuoka (JP)

(73) Assignee: PIONEER CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/425,280

(22) PCT Filed: Sep. 7, 2012

(86) PCT No.: PCT/JP2012/072953
§ 371 (c)(1),
(2), (4) Date: Mar. 2, 2015

(87) PCT Pub. No.: WO2014/038071
PCT Pub. Date: Mar. 13, 2014

(65) Prior Publication Data
US 2016/0013417 A1  Jan. 14, 2016

(51) Int. Cl.
*H01L 51/00* (2006.01)
*H01L 51/50* (2006.01)
*H01L 51/56* (2006.01)

(52) U.S. Cl.
CPC ....... *H01L 51/0036* (2013.01); *H01L 51/0039* (2013.01); *H01L 51/0043* (2013.01); *H01L 51/5056* (2013.01); *H01L 51/0003* (2013.01); *H01L 51/5088* (2013.01); *H01L 51/56* (2013.01)

(58) Field of Classification Search
CPC .......... H01L 51/0036; H01L 51/5056; H01L 51/5088; H01L 51/56
See application file for complete search history.

(56) References Cited

U.S. PATENT DOCUMENTS

| | | |
|---|---|---|
| 7,901,766 B2 | 3/2011 | Muller et al. |
| 8,222,807 B2 | 7/2012 | Ogata et al. |
| 2006/0251886 A1 | 11/2006 | Muller et al. |
| 2007/0034862 A1 | 2/2007 | Parham et al. |
| 2010/0090590 A1 | 4/2010 | Ogata et al. |
| 2011/0039124 A1 | 2/2011 | Ikeuchi et al. |
| 2012/0037894 A1* | 2/2012 | Okabe .................. C08G 61/12 257/40 |

(Continued)

FOREIGN PATENT DOCUMENTS

| | | |
|---|---|---|
| JP | 04-342711 A | 11/1992 |
| JP | 2007-504656 A | 3/2007 |

(Continued)

OTHER PUBLICATIONS

International Search Report for PCT/JP2012/072953, dated Oct. 18, 2012.
Yang et al., "Highly Efficient Polymeric Electrophosphorescent Diodes", Advanced Materials, 2006, p. 948-p. 954.

*Primary Examiner* — Mamadou Diallo
(74) *Attorney, Agent, or Firm* — Procopio, Cory, Hargreaves & Savitch LLP

(57) ABSTRACT

In an organic electroluminescence device (100), a hole transport layer (22) is formed of a cured resin obtained by a ring opening polymerization of a polymerizable compound (a) containing a ring opening polymerizable group in the presence of a polymerization initiator (b). In addition, both of a maximum peak height Rp and a maximum valley depth Rv in an upper surface of the hole transport layer (22) are less than or equal to 14 nm. Accordingly, an organic electroluminescence device having excellent mass productivity and high luminescent efficiency is realized.

5 Claims, 3 Drawing Sheets

(56) References Cited

U.S. PATENT DOCUMENTS

2014/0367617 A1* 12/2014 Yoshida .................. C08G 61/12
 252/500
2015/0287927 A1* 10/2015 Okubo ................... B82Y 20/00
 257/40

FOREIGN PATENT DOCUMENTS

| JP | 2008-227483 A | 9/2008 |
| JP | 2010-212354 A | 9/2010 |
| WO | 2009/119563 A1 | 10/2009 |

* cited by examiner

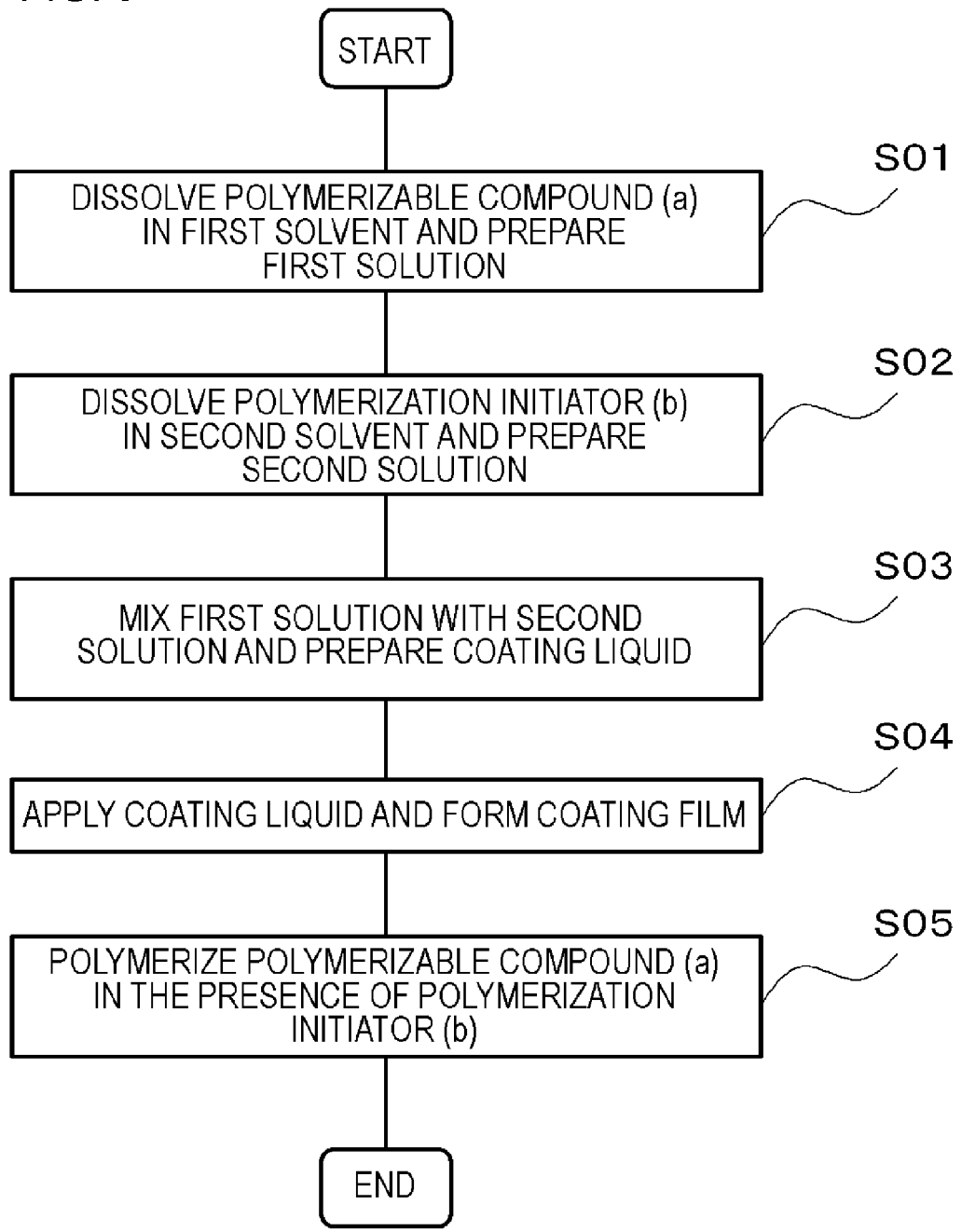

ORGANIC ELECTROLUMINESCENCE DEVICE AND MANUFACTURING METHOD THEREOF

TECHNICAL FIELD

The present invention relates to an organic electroluminescence device, a display device, a luminescent device, and a manufacturing method of an organic electroluminescence device.

BACKGROUND ART

As a method of forming an organic layer configuring an organic electroluminescence device, a vacuum evaporation method, or a coating method using spin coating, an ink jet, or the like is widely used. Among them, the coating method has excellent mass productivity, and has an advantage that process management is facilitated.

The coating method includes a step of applying a solution obtained by dissolving a forming material of an organic thin film in a solvent on an organic thin film which is a base. In this step, when apart of the organic thin film which is the base of the coating is dissolved in the solvent, a layer configuration is not obtained as designed.

For this reason, an attempt has been made to increase solvent resistance by configuring the organic thin film of a cross-linked resin material. In Non-Patent Document 1, such a technology is disclosed. In Non-Patent Document 1, a solution in which a cross-linking resin formed of a diamine derivative and a photopolymerization initiator are dissolved is applied, and then a hole transport layer is formed by allowing the resin to react by light irradiation. Then, on the hole transport layer formed in this way, an organic thin film including a luminescent material is formed by a coating method.

However, when the hole transport layer is formed by using the technology disclosed in Non-Patent Document 1, a sufficient performance as an organic electroluminescence device is not obtained. For example, in Patent Document 1, when an organic layer is formed by polymerizing a polymerizable compound using a technology disclosed in Non-Patent Document 1, there is a problem that drive lifetime is shortened. In order to solve this problem, the technology disclosed in Patent Document 1 includes a hole transport layer which is formed by polymerizing a polymerizable compound, and a hole injection layer which is disposed to be adjacent to the hole transport layer and contains a polymerization reaction initiator.

RELATED DOCUMENT

Patent Document

[Patent Document 1] Japanese Laid-open Patent Publication No. 2008-227483

Non-Patent Document

[Non-Patent Document 1] Advanced Materials 2006, 18, 948-954.

DISCLOSURE OF THE INVENTION

In the organic electroluminescence device, it is important to improve luminescent efficiency. On the other hand, a structure having excellent mass productivity has to be realized. However, in Non-Patent Document 1 and Patent Document 1, it is difficult to realize an organic electroluminescence device having excellent mass productivity and excellent luminescent properties.

Problems to be solved by the present invention include the problems described above as an example.

According to the invention, there is provided an organic electroluminescence device including an anode; an organic layer which is disposed on the anode; a luminescent layer which is disposed on the organic layer; and a cathode which is disposed on the luminescent layer, in which the organic layer is formed of a cured resin which is obtained by a ring opening polymerization of a polymerizable compound (a) containing a ring opening polymerizable group in the presence of a polymerization initiator (b), and both of a maximum peak height Rp and a maximum valley depth Rv in an upper surface of the organic layer are less than or equal to 14 nm.

According to the invention, there is provided a display device using the organic electroluminescence device-.

According to the invention, there is provided, a luminescent device using the organic electroluminescence device.

According to the invention, there is provided, a manufacturing method of an organic electroluminescence device including a step of forming an organic layer on a anode; a step of forming a luminescent layer on the organic layer; and a step of forming a cathode on the luminescent layer, in which the step of forming the organic layer includes a step of preparing a first solution including a polymerizable compound (a) which contains a ring opening polymerizable group, and a second solution including a polymerization initiator (b), a step of preparing a coating liquid by mixing the first solution with the second solution, a step of forming a coating film by applying the coating liquid, and a step of curing the coating film by a ring opening polymerization of the polymerizable compound (a) in the presence of the polymerization initiator (b).

BRIEF DESCRIPTION OF THE DRAWINGS

FIG. 3 is a flow diagram describing a forming method of a hole transport layer illustrated in FIG. 1.

DESCRIPTION OF EMBODIMENTS

Figure 1:
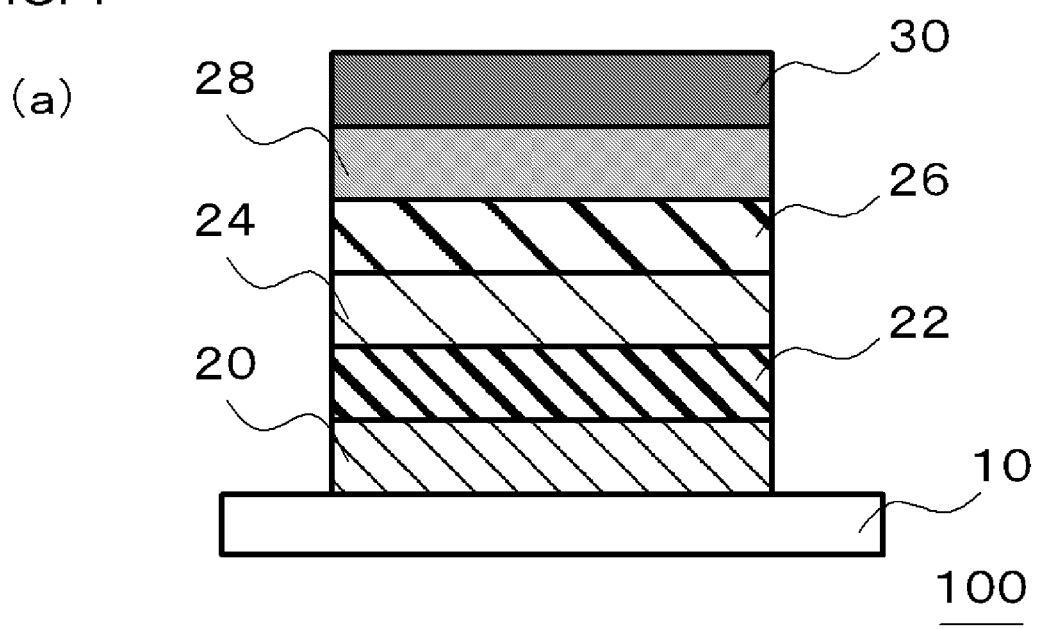
FIG. 1 is a cross-sectional view illustrating an organic electroluminescence device according to this embodiment.
Figure 1:
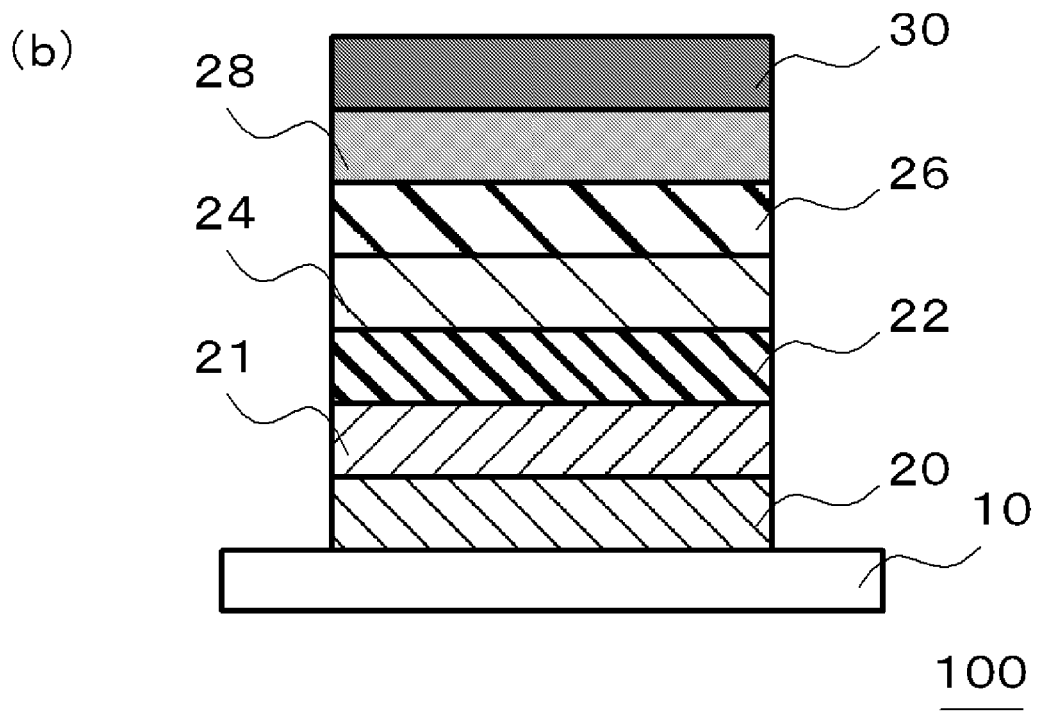

Hereinafter, embodiments of the present invention will be described with reference to the drawings. Furthermore, in all drawings, the same reference numerals are applied to the same constituents, and the description thereof will not be repeated. Herein, "disposed on a certain layer" includes both of a case of being disposed to be in contact with the layer and a case of being disposed above the layer through other layers.

FIG. 1 is a cross-sectional view illustrating an organic electroluminescence device 100 according to this embodiment. Furthermore, FIG. 1 is a schematic view for illustrating the organic electroluminescence device 100, and a configuration of the organic electroluminescence device 100 according to this embodiment is not limited to a configuration illustrated in FIG. 1.

FIG. 1(*a*) illustrates a case where a hole injection layer is not included, and FIG. 1(*b*) illustrates a case where a hole injection layer 21 is included. In this embodiment, in particular, the organic electroluminescence device 100 illustrated in FIG. 1(a) will be described.

In the organic electroluminescence device 100 according to this embodiment, a hole transport layer 22 (an organic layer), a luminescent layer 24, an electron transport layer 26, an electron injection layer 28, and a cathode 30 are formed on a anode 20 in this order. The hole transport layer 22 is formed of a resin composition which is obtained by a ring opening polymerization of a polymerizable compound (a) containing a ring opening polymerizable group in the presence of a polymerization initiator (b). Both of a maximum peak height Rp and a maximum valley depth Rv in an upper surface of the hole transport layer 22 are less than or equal to 14 nm.

Hereinafter, the configuration of the organic electroluminescence device 100 according to this embodiment will be described in detail.

The organic electroluminescence device 100 is disposed on a substrate 10.

As a material configuring the substrate 10, quartz, glass, metal or a metal oxide, a resin, and the like are included. When the substrate 10 is configured of a resin, as a resin material, polyester, poly(meth) acrylate, polycarbonate, polysulfone, and the like are included. These resin materials may be independently used, or may be used in any combination of two or more thereof.

A thickness of the substrate 10 is not particularly limited, and for example, is greater than or equal to 1 μm and less than or equal to 50 mm, and preferably greater than or equal to 50 μm and less than or equal to 3 mm. By setting the thickness of the substrate 10 to be in a range described above, it is possible to reduce a weight of an organic electroluminescence device and to obtain sufficient mechanical strength.

As illustrated in FIG. 1(a), the anode 20 is disposed on the substrate 10.

It is preferable that a material configuring the anode 20 is a conductive material having a work function greater than that of the cathode 30.

The anode 20 is configured of a metallic material such as aluminum, gold, silver, nickel, palladium, or platinum, a metal oxide obtained by oxidizing a metallic material such as indium, zinc, tin, or an alloy thereof, a metal halide such as copper iodide, carbon black, a conductive polymer such as polypyrrole, polyaniline, poly(3-methylthiophene), or (Poly(3,4-ethylenedioxythiophene)poly(styrenesulfonate)) (PEDOT:PSS), or the like. Among them, an Indium-Tin-Oxide (ITO), an Indium-Zinc-Oxide (IZO), a zinc oxide, or a tin oxide is particularly preferable. These materials may be independently used, or may be used in any combination of two or more thereof. Furthermore, the material of the anode 20, for example, is able to be suitably selected according to transparency required for the anode 20.

When emitted light is taken from the anode 20 side, the anode 20 is transparent or semi-transparent with respect to a wavelength of the emitted light. In this case, transmissivity of light having a luminescence wavelength in the anode 20, for example, is greater than or equal to 60%, and preferably greater than or equal to 80%.

Furthermore, when the anode 20 is transparent or semi-transparent, a film thickness of the anode 20, for example, is greater than or equal to 5 nm and less than or equal to 1000 nm, and preferably greater than or equal to 10 nm and less than or equal to 500 nm. Accordingly, it is possible to suppress an increase in electric resistance due to thinning of the film thickness while ensuring transparency.

The hole transport layer 22 is disposed on the anode 20.

In this embodiment, the hole transport layer 22 is formed of the resin composition obtained by the ring opening polymerization of the polymerizable compound (a) containing the ring opening polymerizable group in the presence of the polymerization initiator (b). Specifically, a layer forming material containing both of the polymerizable compound (a) and the polymerization initiator (b) is applied, then components (a) and (b) described above react with each other, and thus the hole transport layer 22 is formed.

As described above, the polymerizable compound (a) has a ring opening polymerizable group in a molecular structure. The ring opening polymerizable group is a group having a hetero ring structure in which the ring opening polymerization progresses due to an action of a cation, an anion, a radical, or the like. As a polymerization mode, a cationic or an anionic ring opening polymerization is preferable. As a hetero ring configuring the ring opening polymerizable group, an epoxy ring, an oxetane ring, a tetrahydrofuran ring, a lactone ring, a carbonate ring, an oxazoline ring, an episulfide ring, and the like are included. Among them, an epoxy ring, and an oxetane ring are preferable. Thus, when an epoxy group or an oxetanyl group is selected as the ring opening polymerizable group, it is possible to form a hole transport layer 22 having excellent solvent resistance.

The polymerizable compound (a) has the ring opening polymerizable group, and thus a resin having a three dimensional network structure is formed by a cross-linking reaction. For this reason, it is possible to form a hole transport layer 22 which is insoluble in an organic solvent and has excellent chemical stability.

The ring opening polymerizable group is ring opened by the polymerization initiator (b), and thus a polymerization of the polymerizable compound (a) progresses, and a cured resin having a three dimensional network structure is formed. Such a polymerization mode is adopted, and thus water is not generated at the time of a polymerization reaction, and it is possible to suppress a decrease in luminescent efficiency due to the polymerization reaction.

It is preferable that the number of ring opening polymerizable groups in one molecule of the polymerizable compound (a) is greater than or equal to 2. That is, it is preferable that the polymerizable compound (a) includes a bifunctional or a multifunctional (trifunctional or more) polymerizable compound. Thus, it is possible to form a hole transport layer 22 having a high cross-link density and excellent chemical stability such as solvent resistance.

Here, when the bifunctional or the multifunctional (trifunctional or more) polymerizable compound is used, in general, chemical and mechanical properties of the cured resin are improved, while reactivity of the polymerizable compound (a) increases, and thus a usable time of the layer forming material tends to be shortened. For this reason, from a viewpoint of keeping a balance between improvement in a cross-link density and reactivity, various compounds are able to be used by being incorporated as the polymerizable compound (a). For example, any one of a mixture of a monofunctional polymerizable compound and a bifunctional polymerizable compound, a mixture of a monofunctional polymerizable compound and a multifunctional polymerizable compound, a mixture of a bifunctional polymerizable compound and a multifunctional polymerizable compound, and a mixture of a monofunctional polymerizable compound, a bifunctional polymerizable compound, and a multifunctional polymerizable compound is able to be used.

Furthermore, as the resin material configuring the hole transport layer 22, a polymerizable compound other than the polymerizable compound (a) described above may be used in combination.

As the polymerizable compound (a), a triarylamine derivative, a carbazole derivative, a fluorene derivative, a 2,4,6-triphenyl pyridine derivative, a $C_{60}$ derivative, an oligothiophene derivative, a phthalocyanine derivative, a porphyrin derivative, a condensed polycyclic aromatic derivative, a metal complex derivative, and the like are included. Among them, a triarylamine derivative having high electrochemical stability and high charge transport properties is preferable. That is, it is preferable that the polymerizable compound (a) is a compound having a triarylamine structure.

As the polymerizable compound (a), the following compounds not having a repeating unit are able to be used.

[Chemical Formula 1]

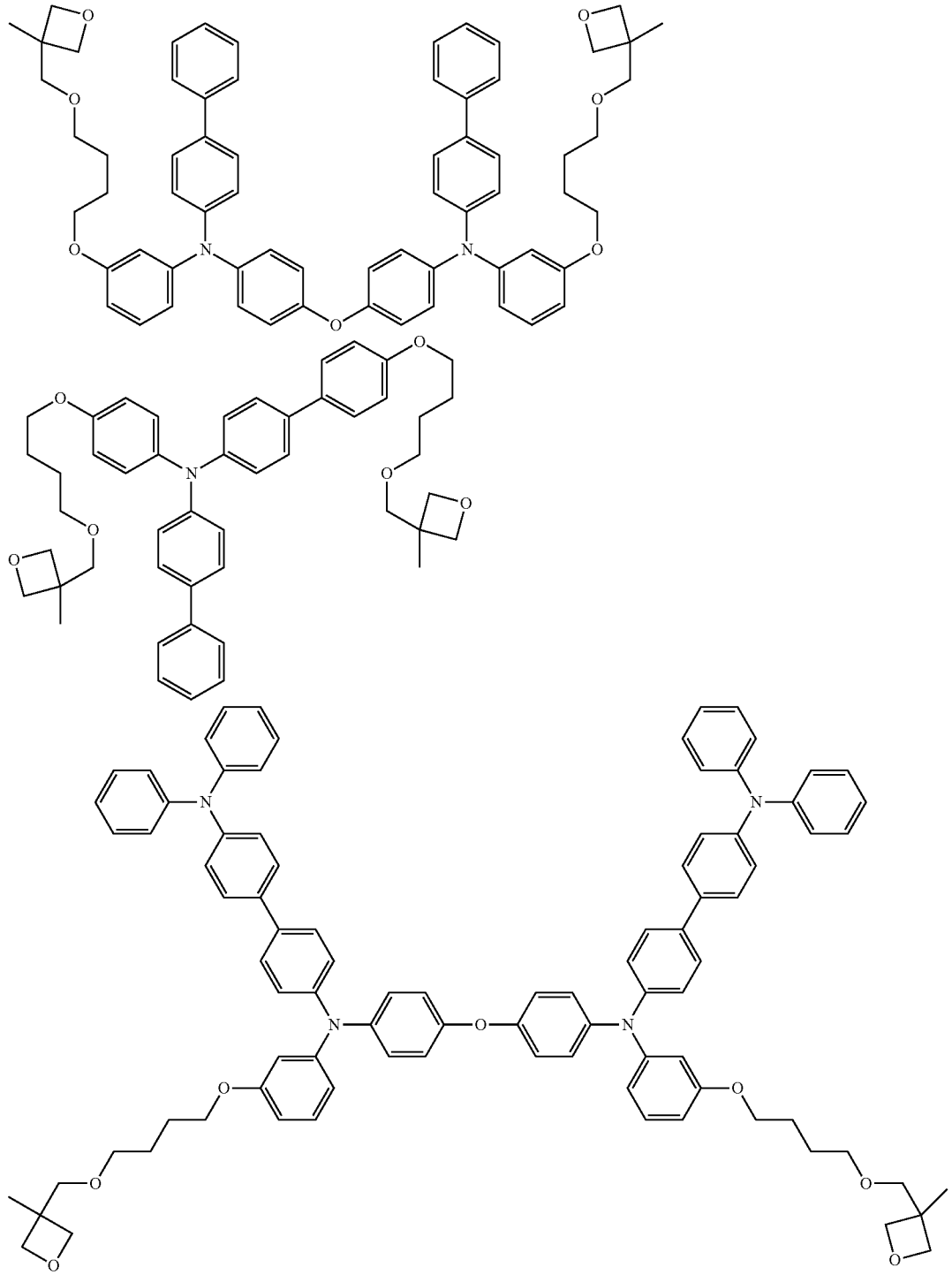

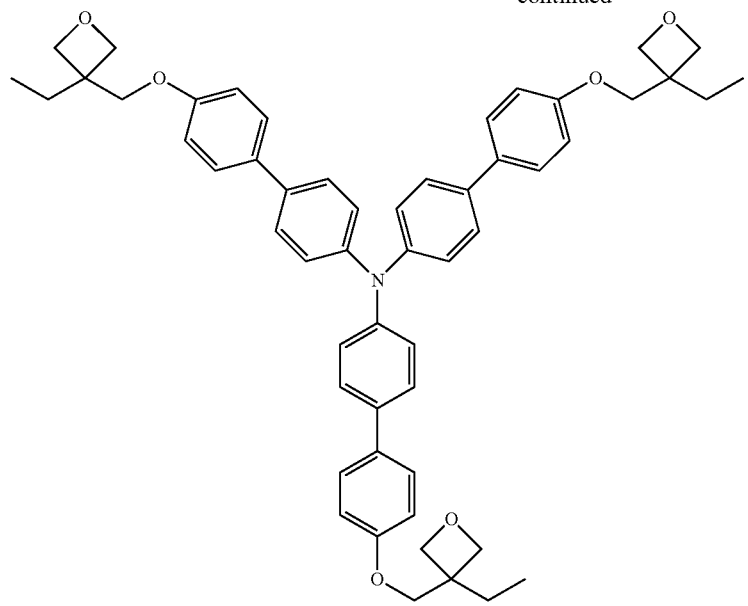
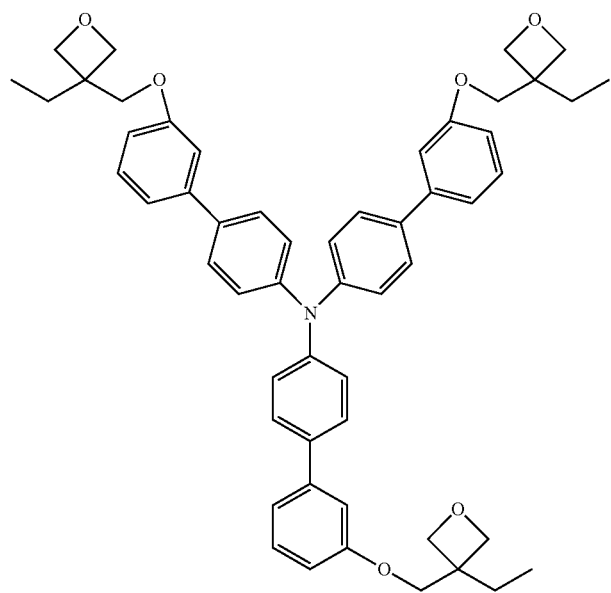

-continued
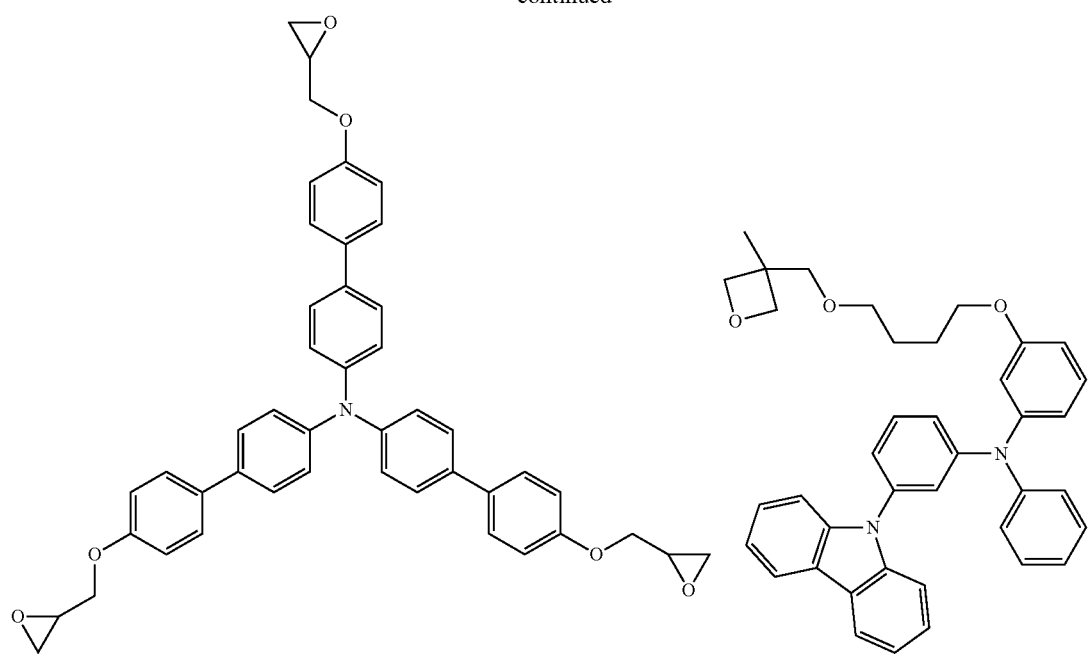
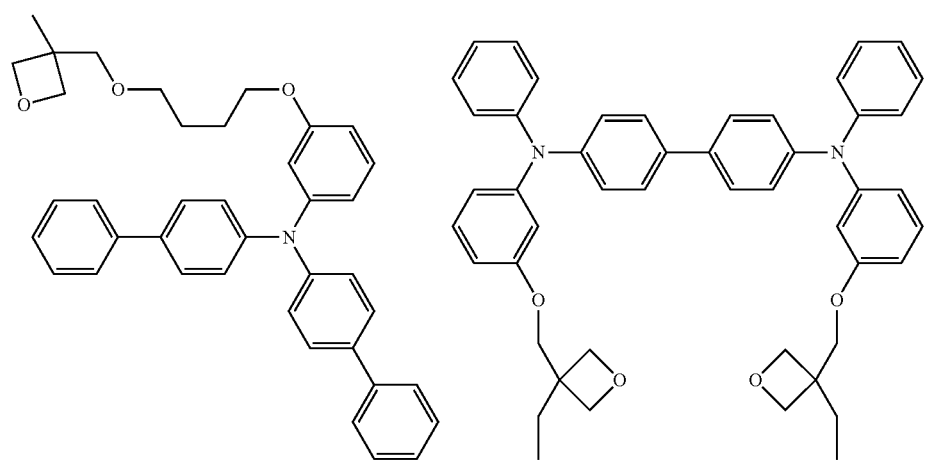 [SMILES: CC1(COCCCCOc2cccc(N(c3ccc(-c4ccccc4)cc3)c3ccc(-c4ccccc4)cc3)c2)COC1 ; CCC1(COc2cccc(N(c3ccccc3)c3ccc(-c4ccc(N(c5ccccc5)c5cccc(OCC6(CC)COC6)c5)cc4)cc3)c2)COC1]

In addition, as the polymerizable compound (a), the following polymerizable oligomers having a repeating unit are able to be used.
[Chemical Formula 2]
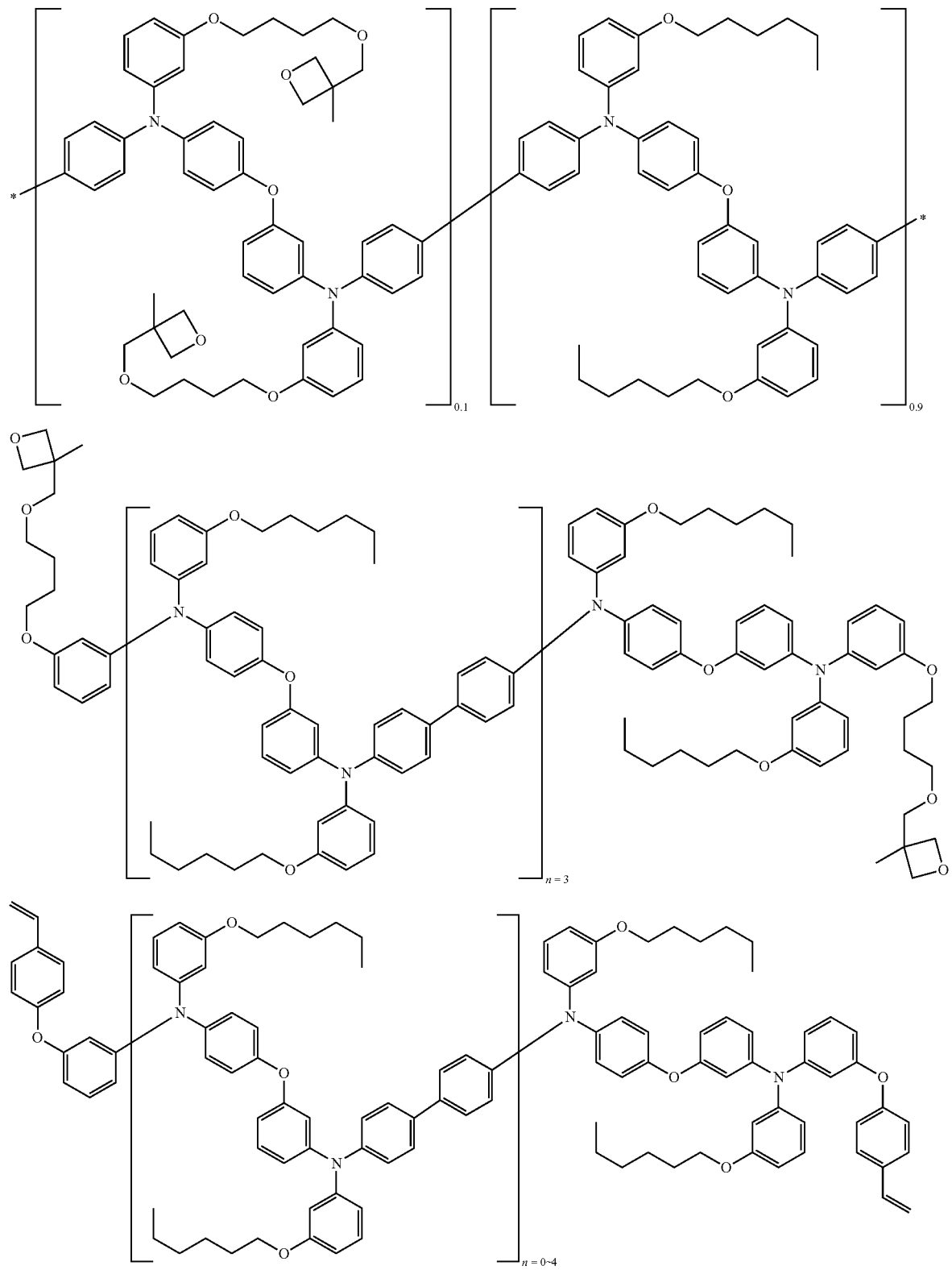

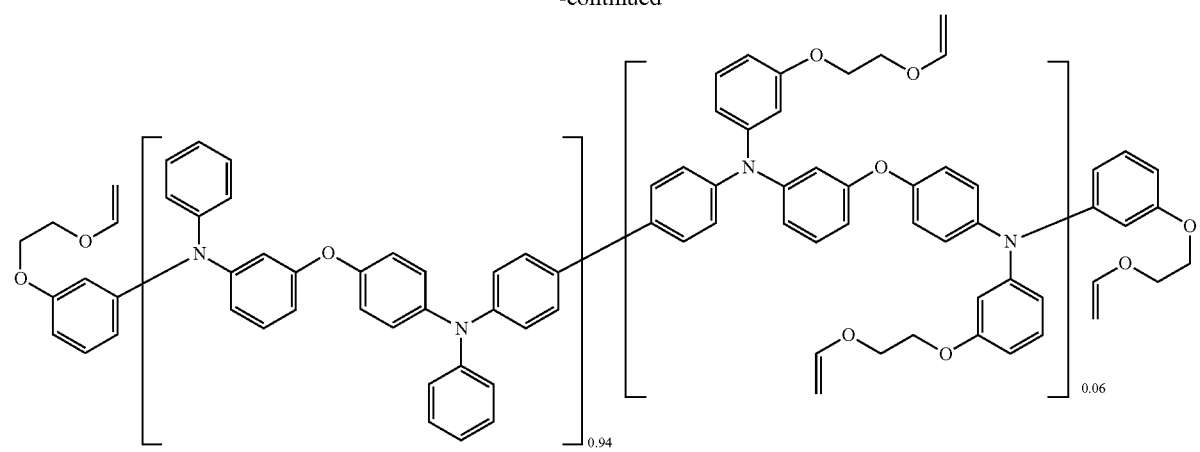
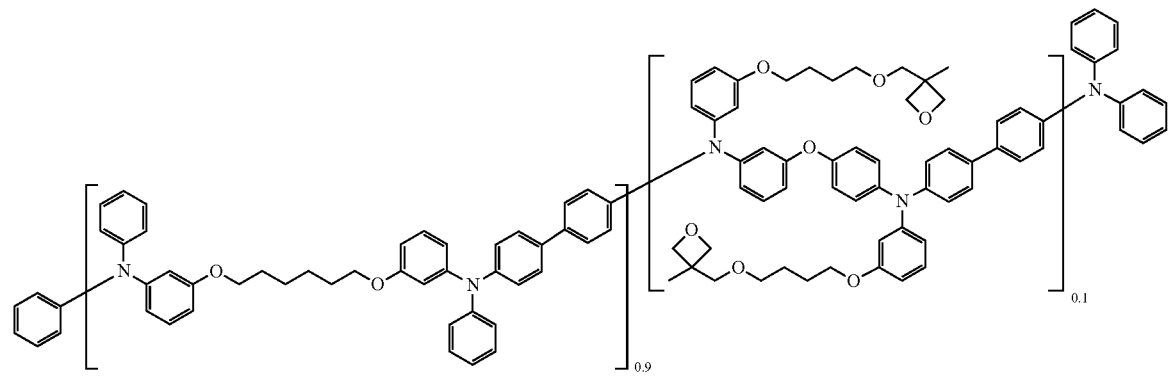
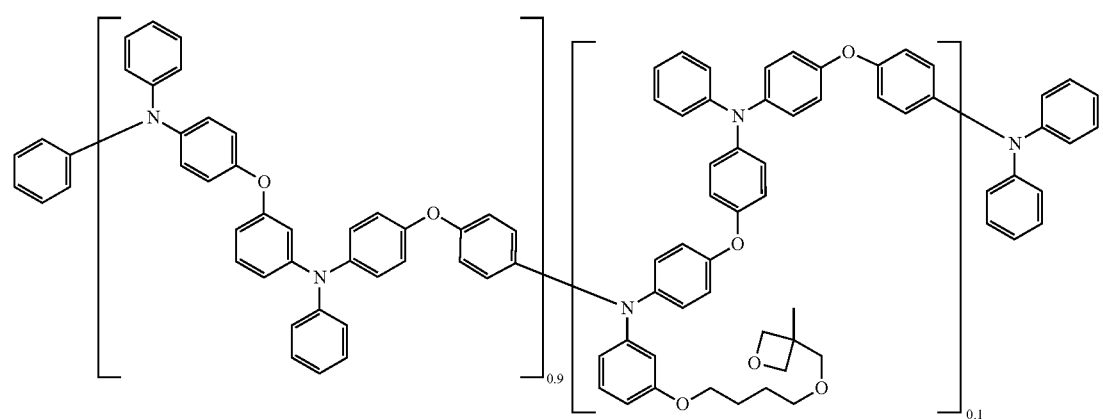

-continued

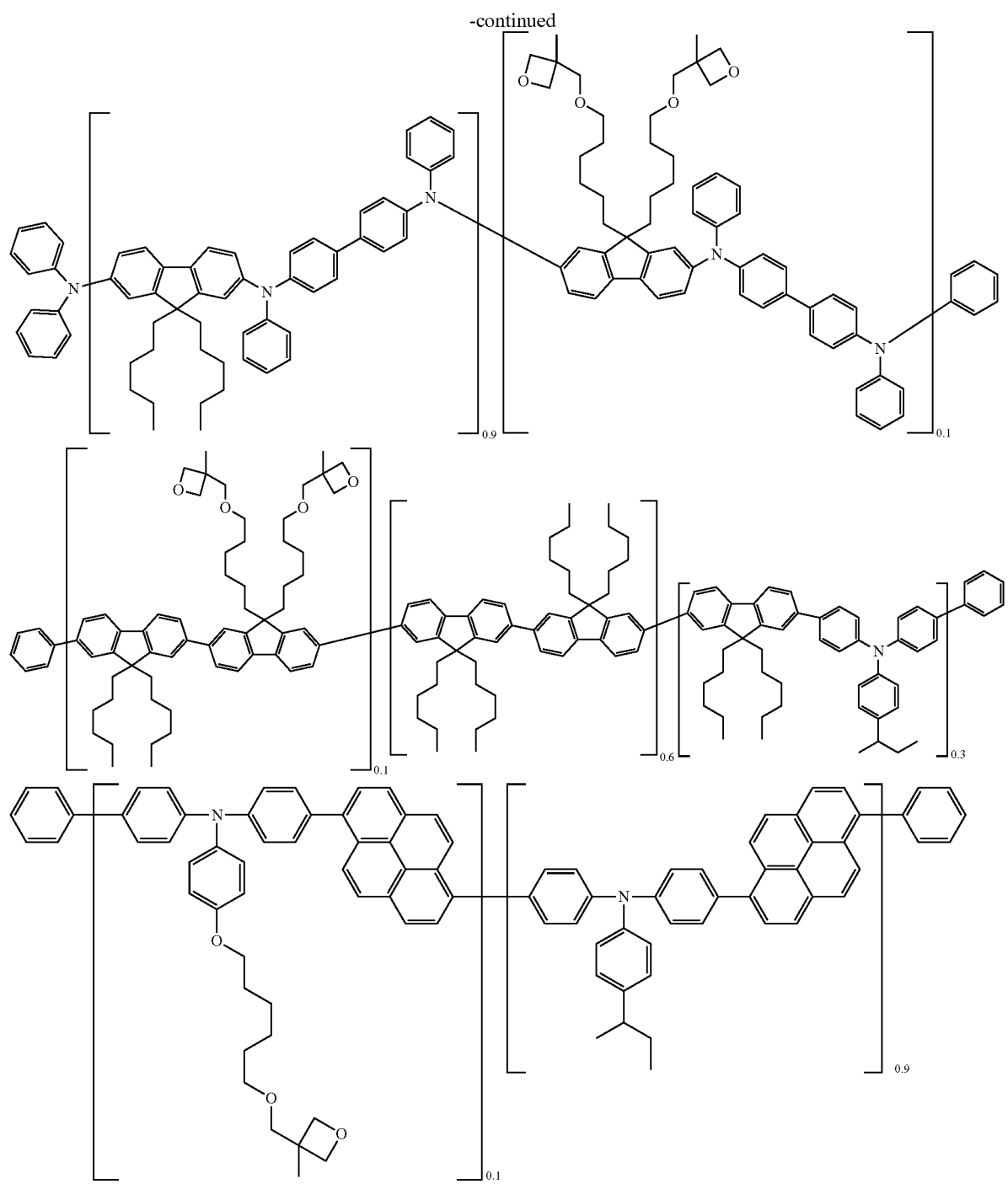

Furthermore, as the polymerizable compound (a), one selected from the compounds described above may be independently used, or any combination of two or more thereof may be used.

When the polymerizable compound (a) is the compound not having a repeating unit, a weight-average molecular weight of the polymerizable compound (a), for example, is greater than or equal to 300 and less than or equal to 5000, and preferably greater than or equal to 500 and less than or equal to 2500. Accordingly, it is possible to ensure solubility with respect to a solvent while realizing sufficient charge transport properties.

In addition, when the polymerizable compound (a) is the polymerizable oligomer, the weight-average molecular weight of the polymerizable compound (a), for example, is greater than or equal to 500 and less than or equal to 2000000, preferably greater than or equal to 2000 and less than or equal to 500000, and more preferably greater than or equal to 4000 and less than or equal to 200000. By setting the weight-average molecular weight to be greater than or equal to a lower limit value described above, it is possible to make film formability of the hole transport layer 22 excellent. In addition, a decrease in a glass transition temperature, a melting point, and a vaporization temperature is suppressed, and heat resistance is able to be ensured. On the other hand, by setting the weight-average molecular weight to be less than or equal to an upper limit value described above, purification of the polymerizable compound (a) is able to be easily performed.

Furthermore, the weight-average molecular weight is obtained from a conversion value which is measured by using Gel Permeation Chromatography (GPC) and by comparison with a standard polymer such as polystyrene.

As the polymerization initiator (b) of this embodiment, for example, a compound generating an anion and a cation is included. The cation is converted into a normal state after contributing to the polymerization reaction of the polymerizable compound (a), and performs charge transport as apart of the hole transport layer. For this reason, by using the compound generating an anion and a cation as the polymerization initiator (b), hole transport properties of the hole transport layer 22 are able to be improved while retaining the function of the polymerization initiator (b).

As the compound generating an anion and a cation, an organic onium salt is included. In this embodiment, organic onium salts indicated by the following formulas (1) to (3) are preferably used.

[Chemical Formula 3]

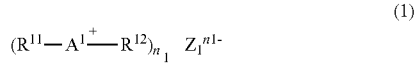

(1)

[Chemical Formula 4]

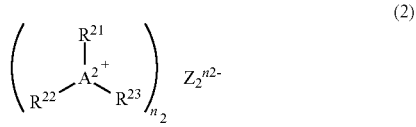

(2)

[Chemical Formula 5]

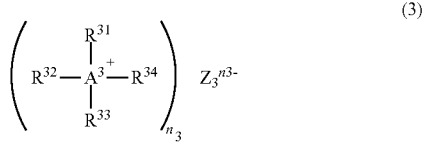

(3)

In the formulas (1) to (3) described above, $R^{11}$, $R^{21}$, and $R^{31}$ each represent an organic group bonded to $A^1$, $A^2$, and $A^3$ by a carbon atom. $R^{11}$, $R^{21}$, and $R^{31}$ in this embodiment include an alkyl group, an alkenyl group, an alkynyl group, an aromatic hydrocarbon group, or an aromatic heterocyclic group. Among them, an aromatic hydrocarbon group or an aromatic heterocyclic group is preferable from a viewpoint of delocalization of a positive electric charge and a viewpoint of thermal stability.

As an alkyl group configuring $R^{11}$, $R^{21}$, and $R^{31}$, a linear alkyl group, a branched alkyl group, a cyclic alkyl group, or the like is able to be used. The number of carbon atoms of the alkyl group, for example, is greater than or equal to 1 and less than or equal to 12, and preferably greater than or equal to 1 and less than or equal to 6. As the alkyl group in this embodiment, a methyl group, an ethyl group, an n-propyl group, a 2-propyl group, an n-butyl group, an isobutyl group, a tert-butyl group, a cyclohexyl group, and the like are included.

The number of carbon atoms of an alkenyl group configuring $R^{11}$, $R^{21}$, and $R^{31}$, for example, is greater than or equal to 2 and less than or equal to 12, and preferably greater than or equal to 2 and less than or equal to 6. As the alkenyl group in this embodiment, a vinyl group, an allyl group, a 1-butenyl group, and the like are included.

The number of carbon atoms of an alkynyl group configuring $R^{11}$, $R^{21}$, and $R^{31}$, for example, is greater than or equal to 2 and less than or equal to 12, and preferably greater than or equal to 2 and less than or equal to 6. As the alkynyl group in this embodiment, an ethynyl group, a propargyl group, and the like are included.

As an aromatic hydrocarbon group configuring $R^{11}$, $R^{21}$, and $R^{31}$, for example, a univalent group derived from a single five membered ring or six membered ring, or 2 to 5 condensed rings on which a positive electric charge is further delocalized is included. As the aromatic hydrocarbon group in this embodiment, a univalent group derived from a benzene ring, a naphthalene ring, an anthracene ring, a phenanthrene ring, a perylene ring, a tetracene ring, a pyrene ring, a benzpyrene ring, a chrysene ring, a triphenylene ring, an acenaphthene ring, a fluorene ring, or the like is included.

In addition, as an aromatic heterocyclic group configuring $R^{11}$, $R^{21}$, and $R^{31}$, for example, a univalent group derived from a single five membered ring or 6 membered ring, or 2 to 4 condensed rings on which a positive electric charge is further delocalized is included. As the aromatic heterocyclic group in this embodiment, a univalent group derived from a furan ring, a benzofuran ring, a thiophene ring, a benzothiophene ring, a pyrrole ring, a pyrazole ring, a triazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, an azulene ring, or the like is included.

In the formulas (1) to (3) described above, $R^{12}$, $R^{22}$, $R^{23}$, $R^{32}$, $R^{33}$, and $R^{34}$ each independently represent an arbitrary group. As $R^{12}$, $R^{22}$, $R^{23}$, $R^{32}$, $R^{33}$, and $R^{34}$ in this embodiment, an alkyl group, an alkenyl group, an alkynyl group, an aromatic hydrocarbon group, an aromatic heterocyclic group, an amino group, an alkoxy group, an aryloxy group, an acyl group, an alkoxycarbonyl group, an aryloxycarbonyl group, an alkylcarbonyl group, an alkylthio group, an arylthio group, a sulfonyl group, an alkylsulfonyl group, an arylsulfonyl group, a sulfonyloxy group, a cyano group, a hydroxyl group, a thiol group, a silyl group, and the like are included. Among them, an aromatic hydrocarbon group or an aromatic heterocyclic group is preferable from a viewpoint of electron acceptability and thermal stability. A molecular weight of $R^{12}$, $R^{22}$, $R^{23}$, $R^{32}$, $R^{33}$, and $R^{34}$, for example, is less than or equal to 1000, and preferably less than or equal to 500 as a value including a substituent group.

As an alkyl group, an alkenyl group, an alkynyl group, an aromatic hydrocarbon group, and an aromatic heterocyclic group configuring $R^{12}$, $R^{22}$, $R^{23}$, $R^{32}$, $R^{33}$, and $R^{34}$, the same groups as that of $R^{11}$, $R^{21}$, and $R^{31}$ are able to be used.

As an amino group configuring $R^{12}$, $R^{22}$, $R^{23}$, $R^{32}$, $R^{33}$, and $R^{34}$, an alkylamino group, an arylamino group, an acylamino group, and the like are included.

As an alkylamino group configuring $R^{12}$, $R^{22}$, $R^{23}$, $R^{32}$, $R^{33}$, and $R^{34}$, an alkylamino group having one or more alkyl groups of which the number of carbon atoms is greater than or equal to 1 and less than or equal to 12, and preferably greater than or equal to 1 and less than or equal to 6 is included. As the alkylamino group in this embodiment, a methylamino group, a dimethylamino group, a diethylamino group, a dibenzylamino group, and the like are included.

As an arylamino group configuring $R^{12}$, $R^{22}$, $R^{23}$, $R^{32}$, $R^{33}$, and $R^{34}$, an arylamino group having one or more aromatic heterocyclic groups or aromatic hydrocarbon groups of which the number of carbon atoms is greater than or equal to 3 and less than or equal to 25, and preferably greater than or equal to 4 and less than or equal to 15 is included. As the arylamino group in this embodiment, a phenylamino group, a diphenylamino group, a tolylamino group, a pyridylamino group, a thienylamino group, and the like are included.

As an acylamino group configuring $R^{12}$, $R^{22}$, $R^{23}$, $R^{32}$, $R^{33}$, and $R^{34}$, an acylamino group having one or more acyl groups of which the number of carbon atoms is greater than or equal to 2 and less than or equal to 25, and preferably greater than or equal to 2 and less than or equal to 15 is included. As the acylamino group in this embodiment, an acetylamino group, a benzoylamino group, and the like are included.

The number of carbon atoms of an alkoxy group configuring $R^{12}$, $R^{22}$, $R^{23}$, $R^{32}$, $R^{33}$, and $R^{34}$, for example, is greater than or equal to 1 and less than or equal to 12, and preferably greater than or equal to 1 and less than or equal to 6. As the alkoxy group in this embodiment, a methoxy group, an ethoxy group, a butoxy group, and the like are included.

As an aryloxy group configuring $R^{12}$, $R^{22}$, $R^{23}$, $R^{32}$, $R^{33}$, and $R^{34}$, an aryloxy group having an aromatic hydrocarbon group or an aromatic heterocyclic group of which the number of carbon atoms is greater than or equal to 3 and less than or equal to 25, and preferably greater than or equal to 4 and less than or equal to 15 is included. As the aryloxy group in this embodiment, a phenyloxy group, a naphthyloxy group, a pyridyloxy group, for example, a thienyloxy group, and the like are included.

The number of carbon atoms of an acyl group configuring $R^{12}$, $R^{22}$, $R^{23}$, $R^{32}$, $R^{33}$, and $R^{34}$ is greater than or equal to 1 and less than or equal to 25, and preferably greater than or equal to 1 and less than or equal to 15. As the acyl group in this embodiment, a formyl group, an acetyl group, a benzoyl group, and the like are included.

The number of carbon atoms of an alkoxycarbonyl group configuring $R^{12}$, $R^{22}$, $R^{23}$, $R^{32}$, $R^{33}$, and $R^{34}$ is greater than or equal to 2 and less than or equal to 10, and preferably greater than or equal to 2 and less than or equal to 7. As the alkoxycarbonyl group in this embodiment, a methoxycarbonyl group, an ethoxycarbonyl group, and the like are included.

As an aryloxycarbonyl group configuring $R^{12}$, $R^{22}$, $R^{23}$, $R^{32}$, $R^{33}$, and $R^{34}$, a group having an aromatic hydrocarbon group or an aromatic heterocyclic group of which the number of carbon atoms is greater than or equal to 3 and less than or equal to 25, and preferably greater than or equal to 4 and less than or equal to 15 is included. As the aryloxycarbonyl group according to this embodiment, a phenoxycarbonyl group, a pyridyloxycarbonyl group, and the like are included.

The number of carbon atoms of an alkylcarbonyloxy group configuring $R^{12}$, $R^{22}$, $R^{32}$, $R^{33}$, and $R^{34}$ is greater than or equal to 2 and less than or equal to 10, and preferably greater than or equal to 2 and less than or equal to 7. As the alkylcarbonyloxy group in this embodiment, an acetoxy group, a trifluoroacetoxy group, and the like are included.

The number of carbon atoms of an alkylthio group configuring $R^{12}$, $R^{22}$, $R^{23}$, $R^{32}$, $R^{33}$, and $R^{34}$ is greater than or equal to 1 and less than or equal to 12, and preferably greater than or equal to 1 and less than or equal to 6. As the alkylthio group according to this embodiment, a methylthio group, an ethylthio group, and the like are included.

The number of carbon atoms of an arylthio group configuring $R^{12}$, $R^{22}$, $R^{23}$, $R^{32}$, $R^{33}$, and $R^{34}$ is greater than or equal to 3 and less than or equal to 25, and preferably greater than or equal to 4 and less than or equal to 14. As the arylthio group in this embodiment, a phenylthio group, a naphthylthio group, a pyridylthio group, and the like are included.

As an alkylsulfonyl group and an arylsulfonyl group configuring $R^{12}$, $R^{22}$, $R^{23}$, $R^{32}$, $R^{33}$, and $R^{34}$, a mesyl group, a tosyl group, and the like are included.

As a sulfonyloxy group configuring $R^{12}$, $R^{22}$, $R^{23}$, $R^{32}$, $R^{33}$, and $R^{34}$, a mesyloxy group, a tosyloxy group, and the like are included.

As a silyl group configuring $R^{12}$, $R^{22}$, $R^{23}$, $R^{32}$, $R^{33}$, and $R^{34}$, a trimethyl silyl group, a triphenyl silyl group, and the like are included.

In the formulas (1) to (3) described above, $A^1$ is an iodine atom, a bromine atom, a chlorine atom, and the like, $A^2$ is a tellurium atom, a selenium atom, a sulfur atom, and the like, and $A^3$ is an antimony atom, an arsenic atom, a phosphorus atom, and the like.

In the formulas (1) to (3) described above, $Z_1^{n1-}$, $Z_2^{n2-}$, and $Z_3^{n3-}$ each are a complex ion indicated by the following formulas (4), (5), and (6).

[Chemical Formula 6]

(4)

[Chemical Formula 7]

(5)

[Chemical Formula 8]

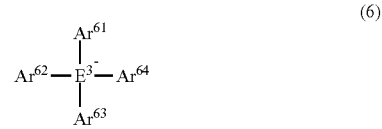
(6)

In the formulas (4) and (6), $E^1$ and $E^3$ each independently are a boron atom, an aluminum atom, a gallium atom, and the like. In addition, in the formula (5), $E^2$ is a phosphorus atom, an arsenic atom, an antimony atom, and the like.

In the formulas (4) and (5), X is a halogen atom such as a fluorine atom, a chlorine atom, or a bromine atom.

In the formula (6), $Ar^{61}$ to $Ar^{64}$ each independently represent an aromatic hydrocarbon group or an aromatic heterocyclic group. $Ar^{61}$ to $Ar^{64}$ in this embodiment represent the same groups as that of $R^{11}$, $R^{21}$, and $R^{31}$ such as a univalent group derived from a single five membered ring or six membered ring, or 2 to 5 condensed rings. Furthermore, $Ar^{61}$ to $Ar^{64}$ may be substituted by an arbitrary group having an electron withdrawing group or the like.

As $Z_1^{n1-}$, $Z_2^{n2-}$, and $Z_3^{n3-}$ configuring the organic onium salt in this embodiment, the following are included.

[Chemical Formula 9]
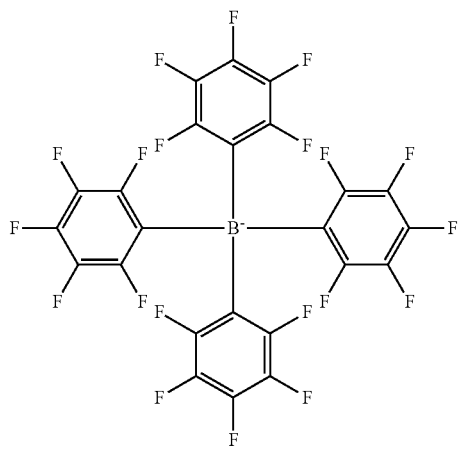
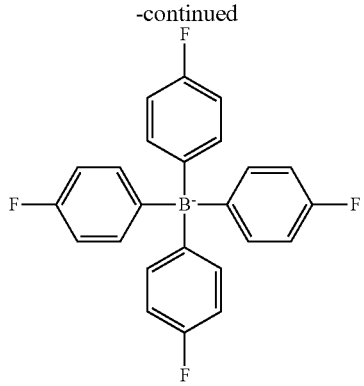
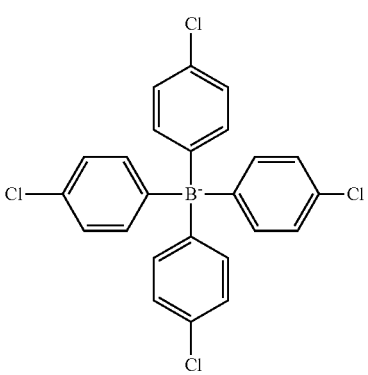
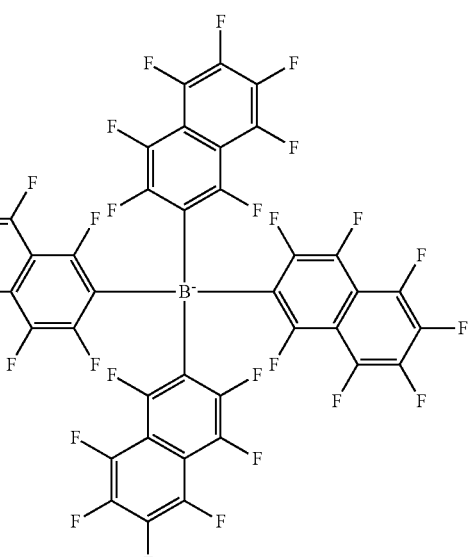
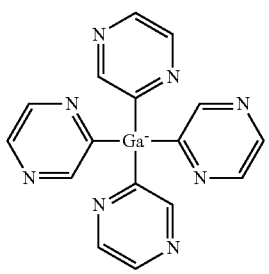

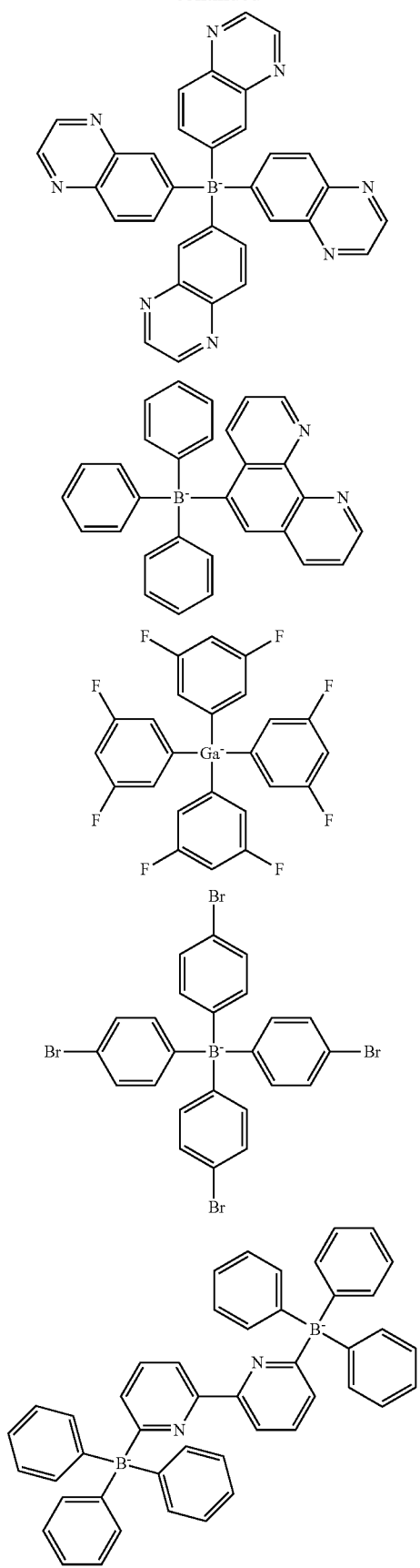
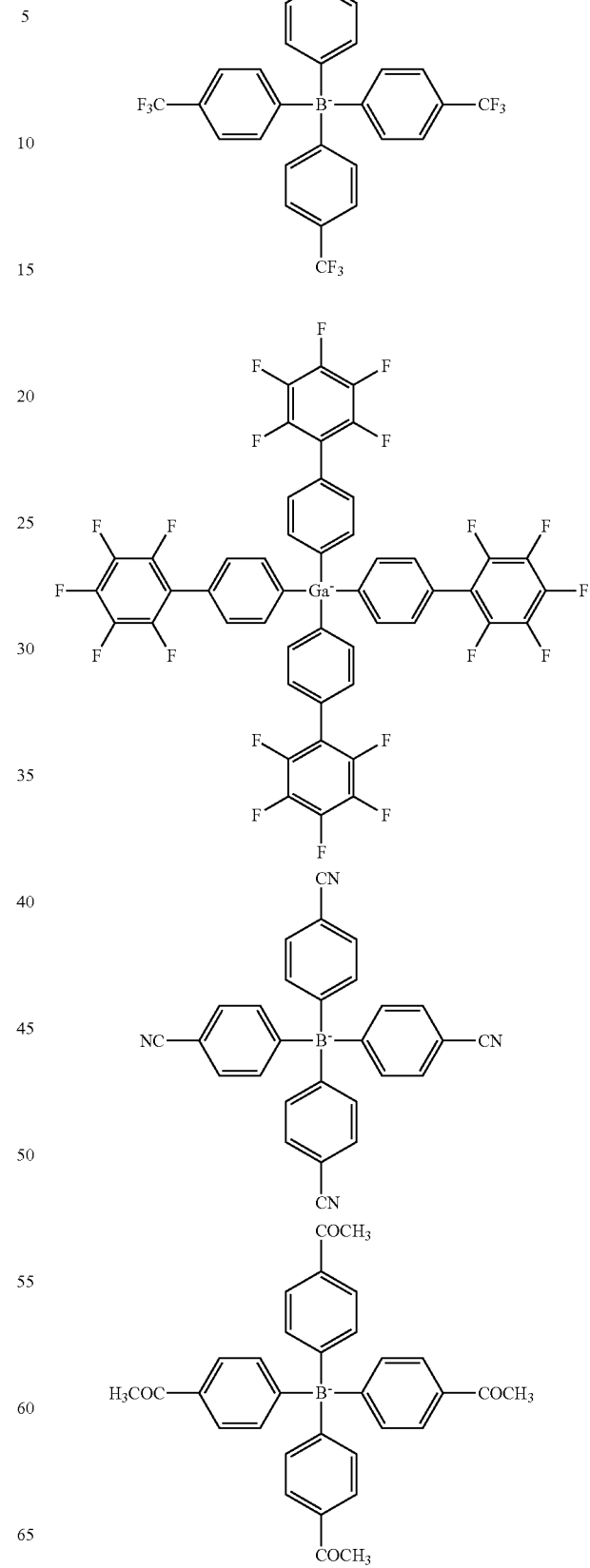

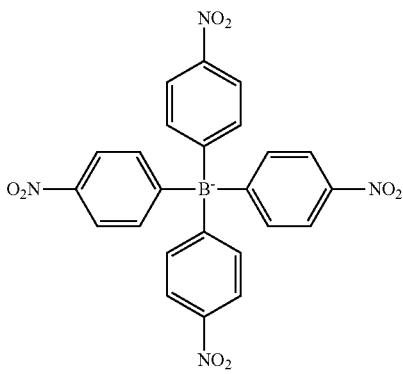

[Chemical Formula 11]

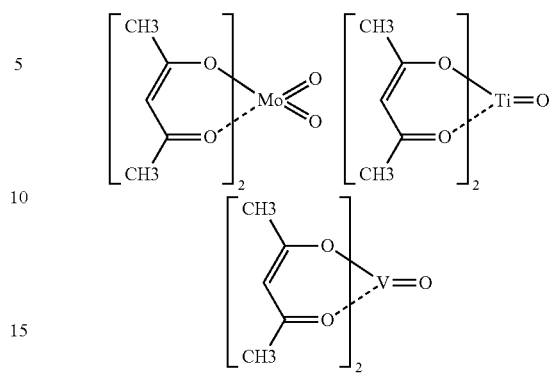

Furthermore, as the organic onium salt in this embodiment, an organic iodonium salt, an organic sulfonium salt, and the like are able to be preferably used.

In this embodiment, as the polymerization initiator (b), an organic onium salt indicated by the following formula (7) is able to be especially preferably used. By using the polymerization initiator (b) of the following formula (7), a hole transport layer 22 having superior film quality can be formed.

[Chemical Formula 10]

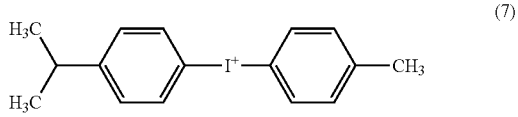 (7)

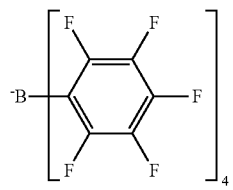

In addition, as the polymerization initiator (b), for example, a metal complex including acetylacetonate as a bidentate ligand is able to be used. In this case, it is possible to realize an organic electrolytic luminescent element having excellent luminance and a long emission lifetime while accelerating a polymerization of the polymerizable compound (a).

As a metal configuring the metal complex, molybdenum, titanium, vanadium, and the like are included. In addition, a methyl group configuring acetylacetonate may be other alkyl groups. As the other alkyl group, a tert-butyl group, and the like are included. Accordingly, it is possible to increase bulkiness, and to improve solubility with respect to a solvent.

In this embodiment, the following metal complexes are able to be used as the polymerization initiator (b).

Furthermore, as the polymerization initiator (b), one selected from the above-described materials may be independently used, or two or more thereof may be used in any combination.

A molecular weight of the polymerization initiator (b), for example, is greater than or equal to 100 and less than or equal to 10000, and preferably greater than or equal to 200 and less than or equal to 3000. Accordingly, it is possible to sufficiently ensure solubility with respect to a solvent while suppressing volatility at the time of forming a coating film.

In this embodiment, both of the maximum peak height Rp and the maximum valley depth Rv in the upper surface of the hole transport layer 22 are less than or equal to 14 nm, and preferably less than or equal to 10 nm. Here, the maximum peak height Rp is a maximum value of a peak height of a contour curve in a reference length defined by JISB0601. The peak height indicates a height from an average line to a peak top. In addition, the maximum valley depth Rv is a maximum value of a valley depth of a contour curve in a reference length defined by JISB0601. The valley depth indicates a depth from the average line to a valley bottom.

The maximum peak height Rp and the maximum valley depth Rv in the upper surface of the hole transport layer 22, for example, are able to be measured by using a method such as Alpha Step IQ (manufactured by KLA-Tencor Corporation), a Scanning Electron Microscope (SEM), or an Atomic Force microscope (AFM).

In order to improve luminescent properties (luminescent efficiency, luminescence unevenness, or the like) of the organic electroluminescence device, the present inventors have found that it is important to precisely control smoothness of an upper surface of an organic layer configuring the organic electroluminescence device. On the basis of such a finding, in this embodiment, the smoothness of the upper surface of the hole transport layer 22 is precisely controlled. Then, as an index indicating smoothness, the maximum peak height Rp and the maximum valley depth Rv are adopted. It is confirmed that this index is an excellent index for controlling luminescent properties of the organic electroluminescence device by experiments conducted by the present inventors.

That is, in this embodiment, the maximum peak height Rp and the maximum valley depth Rv in the upper surface of the hole transport layer 22 are less than or equal to the upper limit value described above. Accordingly, concavities and convexities in the upper surface of the hole transport layer 22 are able to be minimized to the extent of not affecting luminescent properties. Therefore, excellent luminescent properties are able to be realized.

In addition, the maximum peak height Rp and the maximum valley depth Rv in the upper surface of the hole transport layer 22 are set to be less than or equal to the upper limit value described above, and thus concavities and convexities in an upper surface of each organic layer formed on the hole transport layer 22 are able to be minimized to the extent of not affecting luminescent properties.

Furthermore, a lower limit value of the maximum peak height Rp and the maximum valley depth Rv is not particularly limited, and for example, may be 0.1 nm. In this case, it is possible to improve adhesiveness with respect to the luminescent layer 24 disposed on the hole transport layer 22.

In this embodiment, as illustrated in FIG. 1(b), the hole injection layer 21 may be disposed between the hole transport layer 22 and the anode 20. As the hole injection layer 21, for example, a layer of which a difference between a hole conduction level and a work function of the anode 20 is smaller than a difference between the hole conduction level and a work function of the organic layer 22 is used. Accordingly, it is possible to easily perform hole injection from the anode 20.

As a material configuring the hole injection layer 21, a compound having hole transport properties is able to be used. As the material configuring the hole injection layer 21 in this embodiment, an aromatic amine compound, a phthalocyanine derivative, a porphyrin derivative, an oligothiophene derivative, and the like are included. Among them, an aromatic amine compound is preferably used from a viewpoint of amorphous properties, solubility with respect to a solvent, and light transmissive properties.

As the aromatic amine compound configuring the hole injection layer 21, an aromatic tertiary amine compound and the like are used. Accordingly, high hole transport properties are able to be realized. Furthermore, as the aromatic tertiary amine compound, a compound having an aromatic tertiary amine structure and having a group derived from an aromatic tertiary amine is included.

In addition, the hole injection layer 21 may include an electron accepting compound. As the electron accepting compound, an onium salt, a triarylboron compound, a metal halide, a Lewis acid, an organic acid, a salt of an arylamine and a metal halide, a salt of an arylamine and a Lewis acid, and the like are included. By including such an electron accepting compound, it is possible to improve electric conductivity of the hole injection layer 21.

A thickness of the hole injection layer 21, for example, is greater than 1 nm and less than or equal to 1000 nm, and preferably greater than or equal to 10 nm and less than or equal to 500 nm. Accordingly, it is possible to decrease resistance while ensuring hole injection properties.

Furthermore, in this embodiment, the hole injection layer 21 may be formed of a cured resin obtained by a ring opening polymerization of the polymerizable compound (a) containing the ring opening polymerizable group in the presence of the polymerization initiator (b). In this case, both of a maximum peak height Rp and a maximum valley depth Rv in an upper surface of the hole injection layer 21 are less than or equal to 14 nm.

In addition, in this case, the hole transport layer 22 is not particularly limited, and for example, similar to the hole injection layer 21, is configured of a material including the polymerizable compound (a) and the polymerization initiator (b) described above.

As illustrated in FIG. 1(a), the luminescent layer 24 is disposed on the hole transport layer 22. In this embodiment, the luminescent layer 24, for example, is disposed to be in contact with the hole transport layer 22.

The luminescent layer 24 in this embodiment includes a luminescent material. As the luminescent material, either a fluorescent luminescent material or a phosphorescent luminescent material is able to be used, and a phosphorescent luminescent material may be used from a viewpoint of improvement in internal quantum efficiency.

As the phosphorescent luminescent material, a phosphorescent organic metal complex or the like including one or two or more heavy atoms having an atomic weight of greater than or equal to 100 and less than or equal to 200 which are selected from iridium, platinum, osmium, rhenium, gold, tungsten, ruthenium, hafnium, europium, terbium, rhodium, palladium, silver, or the like is used.

In this embodiment, as described above, the luminescent layer 24 includes the luminescent material configured of the heavy atoms of which the atomic weight is greater than or equal to 100 and less than or equal to 200. Accordingly, a repulsive force due to a heavy atom effect occurs between a cation and an anion included in the polymerization initiator (b) inside the hole transport layer 22, and the heavy atoms inside the luminescent layer 24. For this reason, the cation or the anion configuring the polymerization initiator (b) is dispersed in the luminescent layer 24, and thus it is possible to prevent excitons inside the luminescent layer 24 from disappearing.

The luminescent layer 24 in this embodiment, for example, includes a hole transporting compound or an electron transporting compound. As the hole transporting compound, the same material as the material configuring the hole injection layer 21 such as an aromatic amine compound, a phthalocyanine derivative, a porphyrin derivative, or an oligothiophene derivative is included. In addition, as the electron transporting compound, 2,5-bis(1-naphthyl)-1,3,4-oxadiazole, 2,5-bis(6'-(2',2''-bipyridyl))-1,1-dimethyl-3,4-diphenylsilole, bathophenanthroline, 2,9-dimethyl-4,7-diphenyl-1,10-phenanthroline, 2-(4-biphenylyl)-5-(p-tertiary butylphenyl)-1,3,4-oxadiazole, 4,4'-bis(9-carbazole)-biphenyl, bis(2-methyl-8-quinolinolato)(4-phenylphenolato) aluminum, and the like are included.

A thickness of the luminescent layer 24, for example, is greater than or equal to 5 nm and less than or equal to 1000 nm, and preferably greater than or equal to 20 nm and less than or equal to 100 nm. Accordingly, it is possible to improve luminescent efficiency and an emission lifetime while suppressing a voltage of the organic electroluminescence device.

As illustrated in FIG. 1(a), the electron transport layer 26 is disposed on the luminescent layer 24. The electron transport layer 26, for example, is configured of a compound having electron transport properties. In addition, as a material configuring the electron transport layer 26, for example, a material having a function of preventing holes which have been moved from the anode 20 from reaching the cathode 30 is able to be used.

As the material configuring the electron transport layer 26 in this embodiment, a mixed ligand complex such as bis(2-methyl-8-quinolinolato)(phenolato) aluminum, bis(2-methyl-8-quinolinolato)(triphenylsilanolato) aluminum, or tris(8-quinolinolato) aluminum, a metal complex such as a bis(2-methyl-8-quinolato) aluminum-μ-oxo-bis-(2-methyl-8-quinolinato) aluminum binuclear metal complex, a styryl compound such as a distyryl biphenyl derivative, a triazole derivative such as 3-(4-biphenylyl)-4-phenyl-5(4-tert-butyl-phenyl)-1,2,4-triazole, or a phenanthroline derivative such as bathocuproine are included.

Furthermore, as the material configuring the electron transport layer 26, one selected from the materials described above may be independently used, or two or more thereof may be used in any combination.

A thickness of the electron transport layer 26, for example, is greater than or equal to 0.5 nm and less than or equal to 100 nm, and preferably greater than or equal to 1 nm and less than or equal to 50 nm. Accordingly, it is possible to improve drive efficiency of the organic electroluminescence device while ensuring a thickness capable of sufficiently suppressing injection of holes from the anode 20 and suppressing a decrease in luminescent efficiency.

As illustrated in FIG. 1(*a*), the electron injection layer 28 is disposed on the electron transport layer 26. In order to improve electron injection efficiency in the organic electroluminescence device 100, for example, a metal having a small work function, or a compound thereof is used as the electron injection layer 28.

In this embodiment, as a material configuring the electron injection layer 28, an alkali metal such as lithium, sodium, or cesium, an alkaline earth metal such as barium or calcium, or a compound such as CsF, $Cs_2CO_3$, $Li_2O$, or LiF is included. One of these materials may be independently used, or two or more thereof may be used in any combination.

In addition, a thickness of the electron injection layer 28, for example, is greater than or equal to 0.1 nm and less than or equal to 5 nm, and preferably greater than or equal to 0.5 nm and less than or equal to 2 nm.

As illustrated in FIG. 1(*a*), the cathode 30 is formed on the luminescent layer 24. In this embodiment, the cathode 30, for example, is disposed above the luminescent layer 24 through the electron transport layer 26 disposed on the luminescent layer 24 and the electron injection layer 28.

As the cathode 30, for example, a conductive material having a work function smaller than that of the anode 20 is selected.

In this embodiment, a material configuring the cathode 30 is not particularly limited insofar as the material is the conductive material having a work function smaller than that of the anode 20. The cathode 30 is configured of tin, magnesium, indium, calcium, aluminum, or silver, an alloy thereof, or the like. One of these materials may be independently used, or two or more thereof may be used in any combination.

Furthermore, a film thickness of the cathode 30, for example, is greater than or equal to 5 nm and less than or equal to 1000 nm, and preferably greater than or equal to 10 nm and less than or equal to 500 nm. Accordingly, it is possible to suppress an increase in electric resistance due to a reduction in the film thickness while decreasing a film thickness to reduce manufacturing costs.

In this embodiment, both of a maximum peak height Rp and a maximum valley depth Rv in an upper surface of the cathode 30 are less than or equal to 10 nm, and preferably less than or equal to 6 nm. Accordingly, concavities and convexities in the upper surface of the cathode 30 are able to be minimized to the extent of not affecting luminescent efficiency. Therefore, it is possible to suppress a decrease in luminescent efficiency.

Furthermore, a lower limit value of the maximum peak height Rp and the maximum valley depth Rv in the upper surface of the cathode 30 is not particularly limited. However, for example, by setting the lower limit value to be in a range greater than or equal to 0.1 nm, it is possible to sufficiently improve luminescent efficiency of the organic electroluminescence device.

Figure 2:
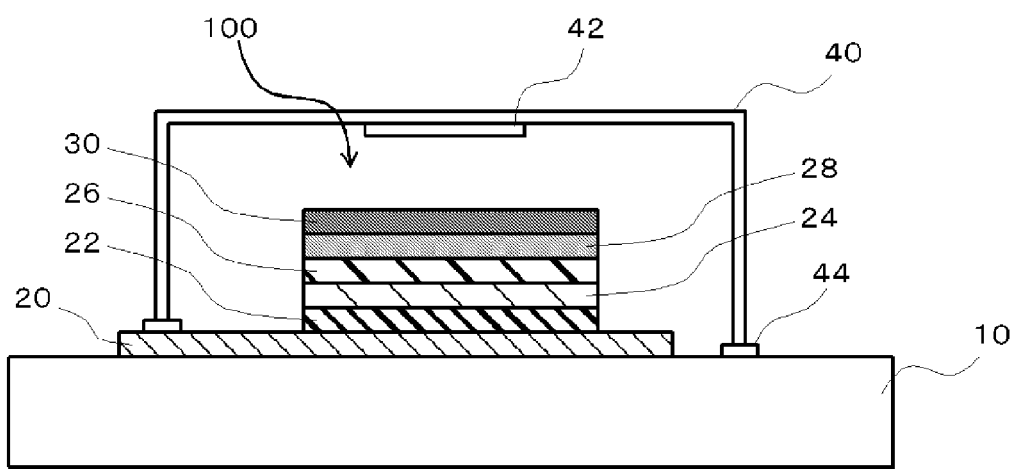
FIG. 2 is a cross-sectional view illustrating a luminescent device including the organic electroluminescence device illustrated in FIG. 1.

FIG. 2 is a cross-sectional view illustrating a luminescent device 200 including the organic electroluminescence device 100 illustrated in FIG. 1(*a*). Furthermore, FIG. 2 is a schematic view for illustrating the luminescent device 200, and a configuration of the luminescent device 200 according to this embodiment is not limited to a configuration illustrated in FIG. 2. The luminescent device 200 is configured by using the organic electroluminescence device 100. The luminescent device 200 according to this embodiment, for example, is able to be used as a display device, or a luminescent device.

The organic electroluminescence device 100 according to this embodiment, for example, is sealed by a metal or a glass sealing case 40. The sealing case 40, for example, is disposed on the substrate 10. In addition, the sealing case 40, for example, is adhered to the substrate 10 by a seal material 44. An inside of the sealing case 40 is able to be sealed by the seal material 44. In addition, the inside of the sealing case 40, for example, is filled with inert gas such as nitrogen gas. Accordingly, the organic electroluminescence device 100 inside the sealing case 40 is able to be prevented from degrading due to oxygen.

In the sealing case 40, for example, a drying agent 42 is disposed. Accordingly, it is possible to prevent element properties of the organic electroluminescence device 100 from being degraded due to moisture existing inside the sealing case 40.

Next, a manufacturing method of the organic electroluminescence device 100 according to this embodiment will be described.

The manufacturing method of the organic electroluminescence device 100 according to this embodiment includes a step of forming the hole transport layer 22 on the anode 20, a step of forming the luminescent layer 24 on the hole transport layer 22, and a step of forming the cathode 30 on the luminescent layer 24. The step of forming the hole transport layer 22 includes a step of preparing a first solution including the polymerizable compound (a) containing the ring opening polymerizable group, and a second solution including the polymerization initiator (b), a step of preparing a coating liquid by mixing the first solution with the second solution, a step of forming a coating film by applying the coating liquid, and a step of curing the coating film by a ring opening polymerization of the polymerizable compound (a) in the presence of the polymerization initiator (b).

Hereinafter, the manufacturing method of the organic electroluminescence device 100 will be described in detail.

First, the anode 20 is formed on the substrate 10. The anode 20 is formed by using a sputtering method, a vacuum evaporation method, or the like.

In addition, when metal fine particles, fine particles of a metal halide, fine particles of a carbon material, fine particles of a metal oxide, or a fine powder of a conductive polymer, and the like are used as the anode 20, for example, these materials are dispersed in a binder resin solution and are applied on the substrate 10, and thus the anode 20 is formed. Further, when a conductive polymer is used as a material of the anode 20, the anode 20 is formed by using an electrolytic polymerization, a coating method, and the like.

Next, the hole transport layer 22 is formed on the anode 20. In this embodiment, the hole transport layer 22, for example, is formed as follows.

FIG. 3 is a flow diagram describing a forming method of the hole transport layer 22 illustrated in FIG. 1(*a*).

First, the first solution including the polymerizable compound (a) containing the ring opening polymerizable group, and the second solution including the polymerization initiator (b) are prepared (S01 and S02). That is, the first solution and the second solution are each independently prepared. The first solution is prepared by dissolving the polymerizable compound (a) in a first solvent. In addition, the second solution is prepared by dissolving the polymerization initiator (b) in a second solvent. In this embodiment, either the first solution or the second solution may be prepared in advance.

In the step of preparing the first solution (S01), for example, the polymerizable compound (a) is dissolved in the first solvent under a temperature condition less than or equal to a boiling point of the first solvent+30° C. When xylene is used as the solvent, the polymerizable compound (a) is dissolved in the first solvent under a temperature condition less than or equal to 165° C. Accordingly, it is possible to prevent a solid content concentration of the first solution from being changed due to volatilization of the first solvent. Therefore, the coating liquid described later is easily prepared.

In addition, in the step of preparing the second solution (S02), for example, the polymerization initiator (b) is dissolved in the second solvent under a temperature condition less than or equal to a boiling point of the second solvent+30° C. When xylene is used as the second solvent, the polymerization initiator (b) is dissolved in the second solvent under a temperature condition less than or equal to 165° C. Accordingly, it is possible to prevent a solid content concentration in the second solution from being changed due to volatilization of the second solvent. Therefore, the coating liquid described later is easily prepared.

In this embodiment, the polymerizable compound (a) and the polymerization initiator (b) are each independently dissolved in prepared solvents. For this reason, in the step of dissolving the polymerizable compound (a), the polymerization initiator (b) does not exist in the solvent, and thus it is possible to prevent the ring opening polymerization of the polymerizable compound (a) from progressing. Therefore, it is possible to widen the process margin with respect to a dissolution temperature and a dissolution time.

As the first solvent, an aliphatic hydrocarbon-based solvent, an aromatic hydrocarbon-based solvent, an ester-based solvent, an ether-based solvent, an amide-based solvent, dimethyl sulfoxide, and the like are included. As the aliphatic hydrocarbon-based solvent, bicyclohexyl, trimethyl cyclohexane, fenchone, menthone, cis-decalin, and the like are included. As the aromatic hydrocarbon-based solvent, benzene, trimethyl benzene, dodecyl benzene, cyclohexyl benzene, toluene, xylene, tetralin, 1,5-dimethyl tetralin, and the like are included. As the ester-based solvent, for example, ethyl acetate, 2-phenoxyethyl acetate, n-butyl acetate, ethyl lactate, n-butyl lactate, methyl benzoate, ethyl benzoate, 4-fluoroethyl benzoate, isopropyl benzoate, butyl benzoate, isopentyl benzoate, benzyl benzoate, and the like are included. As the ether-based solvent, for example, an aliphatic ether such as ethylene glycol dimethyl ether, ethylene glycol diethyl ether, or propylene glycol-1-monomethyl ether acetate, an aromatic ether such as 1,2-dimethoxy benzene, 1,3-dimethoxy benzene, anisole, diphenyl ether, phenetole, 2-methoxy toluene, 3-methoxy toluene, 4-methoxy toluene, 2,3-dimethyl anisole, or 2,4-dimethyl anisole, and the like are included. As the amide-based solvent, N,N-dimethyl formamide, N,N-dimethyl acetamide, and the like are included. Furthermore, one of these solvents may be independently used, or two or more thereof may be used in any combination.

As the second solvent, for example, the same solvents as that of the first solvent are able to be used.

Furthermore, the first solvent and the second solvent may be different from each other. In this case, solubility of each of the polymerizable compound (a) and the polymerization initiator (b) with respect to the solvent is able to be controlled. In addition, by adjusting a difference in boiling points between the first solvent and the second solvent, it is possible to improve film formability.

In this embodiment, the first solution and the second solution may be cooled after the step of preparing the first solution and the second solution (S01 and S02) and before the step of forming the coating liquid by mixing the first solution with the second solution (S03). A cooling method may be natural cooling, or may be air cooling or forced cooling by using a refrigerant.

In this embodiment, the first solution and the second solution, for example, are cooled to be less than or equal to 60° C., and preferably less than or equal to 40° C. Thus, in the step of mixing the first solution with the second solution, it is possible to more reliably prevent a polymerization of the polymerizable compound (a) from progressing.

Subsequently, the first solution including the polymerizable compound (a) and the second solution including the polymerization initiator (b) are mixed, and thus the coating liquid is prepared (S03). This mixing step is performed without heating, or in the case of heating, it is preferable that the heating, for example, is performed under a heating condition of less than or equal to 60° C., from the viewpoint of more reliably suppressing progress of the polymerization of the polymerizable compound (a).

In the technology of the related art, both of the polymerizable compound (a) and the polymerization initiator (b) are dissolved in the same solvent. According to a consideration of the present inventors, it is found that in this case, the following problems occur.

First, in the step of preparing the coating liquid, when the ring opening polymerization of the polymerizable compound (a) progresses to a certain degree in the presence of the polymerization initiator (b), an obtained organic layer has an absorption band in a visible light region. In this case, luminescent properties of the organic electroluminescence device are degraded.

In a case of using a method in which the coating liquid is adjusted by dissolving both of the polymerizable compound (a) and the polymerization initiator (b) in the solvent, the ring opening polymerization of the polymerizable compound (a) progresses when a dissolution temperature is high and a dissolution time is long, and thus the coating liquid is slightly colored. In this case, as described above, the obtained organic layer has an absorption band in the visible light region. On the other hand, even when the coating liquid is not colored and is seemingly colorless, the organic layer has an absorption band in the visible light region when the polymerization progresses to a certain degree.

Second, when the organic layer is formed by applying, drying, and curing the coating liquid in which both of the polymerizable compound (a) and the polymerization initiator (b) are dissolved in the same solvent, minute concavities and convexities having a size of a nm level occur. These minute concavities and convexities cause a decrease in luminescent properties, and thus it is difficult to stably realize excellent luminescent properties.

In contrast, in this embodiment, as described above, in the step of preparing the coating liquid, it is possible to prevent the polymerizable compound (a) from reacting with the polymerization initiator (b). For this reason, it is possible to maintain transparency in the coating liquid including the polymerizable compound (a) and the polymerization initiator (b). In this case, in the hole transport layer 22 formed of the coating liquid described above, transparency thereof is ensured. Therefore, it is possible to suppress a decrease in luminescent properties of the organic electroluminescence device due to a change in color of the organic layer.

In addition, according to this embodiment described above, it is possible to make concavities and convexities in the upper surface of the hole transport layer 22 formed of the coating liquid including the polymerizable compound (a) and the polymerization initiator (b) minute to the extent of not affecting luminescent efficiency. Therefore, it is possible to suppress a decrease in luminescent properties of the organic electroluminescence device due to concavities and convexities formed in the upper surface of the organic layer.

Obtaining such an effect by this embodiment will be indicated by examples described later.

In addition, according to a manufacturing method of an organic electroluminescence device according to this embodiment, as described above, it is possible to prevent the polymerizable compound (a) from reacting with the polymerization initiator (b) before the coating liquid is applied. For this reason, it is possible to suppress an increase in viscosity of the coating liquid before the coating liquid is applied. Therefore, for example, when the coating liquid is applied by an ink jet method, it is possible to prevent a problem that a nozzle is clogged by the coating liquid from occurring.

Furthermore, in this embodiment, the first solution and the second solution may be mixed while controlling a temperature of the first solution and the second solution such that the temperature is less than or equal to 40° C. By controlling a temperature condition at the time of mixing the first solution with the second solution, it is possible to reliably prevent the polymerizable compound (a) from reacting with the polymerization initiator (b) at the time of mixing.

Subsequently, by applying the coating liquid obtained by mixing the first solution with the second solution, the coating film is formed (S04). In this embodiment, the coating liquid described above, for example, is applied on the anode 20. The coating liquid is applied by spin coating, an ink jet, or the like.

In this embodiment, it is possible to dry the coating film described above after the step of forming the coating film (S04) and before the step of curing the coating film by the ring opening polymerization of the polymerizable compound (a) in the presence of the polymerization initiator (b) (S05). The coating film, for example, is dried under an atmosphere at a pressure of less than 2 Pa by using a vacuum dryer. The coating film is dried, and thus when the polymerizable compound (a) is polymerized in the presence of the polymerization initiator (b), it is possible to prevent an unnecessary reaction from being accelerated according to a polarity of the solvent. Therefore, it is possible to ensure transparency of the organic layer formed of the coating film.

Subsequently, the polymerizable compound (a) is polymerized in the presence of the polymerization initiator (b), and thus the coating film is cured (S05). Accordingly, the hole transport layer 22 is formed.

In this embodiment, for example, by heating the coating film, the polymerizable compound (a) is polymerized in the presence of the polymerization initiator (b). At this time, the polymerization is performed in heating conditions, for example, of greater than or equal to 200° C. and less than or equal to 250° C., and longer than or equal to 5 minutes and shorter than or equal to 60 minutes. In this embodiment, the polymerizable compound (a) and the polymerization initiator (b) are included in one coating liquid. For this reason, a sufficient reaction is able to be performed even with a short time for firing. Therefore, it is possible to reduce manufacturing costs of the organic electroluminescence device.

Furthermore, in this embodiment, at the time of curing the coating film, the coating film is not cured by light irradiation, but is cured by adopting a heat curing method. For this reason, a portion having a function of transporting holes in the polymerizable compound (a) is prevented from being oxidized by the light irradiation. Therefore, a decrease in luminescent properties of the organic electroluminescence device due to the step of curing the coating film is suppressed.

In this embodiment, the step of forming the hole injection layer may be included before the step of forming the hole transport layer 22 and the step of forming the anode 20. In this case, the coating liquid for forming the hole transport layer 22 is applied on the hole injection layer. The hole injection layer is formed on the anode 20 by a coating method such as spin coating or an ink jet.

Next, the luminescent layer 24 is formed on the hole transport layer 22.

In this embodiment, the luminescent layer 24, for example, is formed as follows. First, a material configuring the luminescent layer 24 is dissolved in a solvent, and a coating liquid is prepared. As the solvent, for example, an aromatic-based solvent such as toluene, and xylene, and the like are used. Subsequently, the coating liquid is applied on the hole transport layer 22, and thus the coating film is formed on the hole transport layer 22. The coating liquid, for example, is applied by a coating method such as spin coating or an ink jet. Subsequently, the coating film is dried. The coating film, for example, is dried under an atmosphere at a pressure of less than 2 Pa by using a vacuum dryer. Accordingly, the luminescent layer 24 is formed.

Next, the electron transport layer 26 is formed on the luminescent layer 24. The electron transport layer 26 is formed on the luminescent layer 24 by a coating method, a vacuum evaporation method, or the like. When the vacuum evaporation method is used, a deposition source is put into a vacuum deposition machine, the inside of the vacuum deposition machine is depressurized to a set pressure, then the deposition source is heated and vaporized, and thus the electron transport layer 26 is formed. This is the same as in a case where the anode 20, the luminescent layer 24, and the cathode 30 are formed by a vacuum evaporation method.

Next, the electron injection layer 28 is formed on the electron transport layer 26. The electron injection layer 28 is formed on the electron transport layer 26 by a coating method, a vacuum evaporation method, or the like.

Next, the cathode 30 is formed on the electron injection layer 28. The cathode 30 is formed on the electron injection layer 28 by a vacuum evaporation method, a sputtering method, or the like.

According to this embodiment, it is possible to control concavities and convexities in the upper surface of the hole transport layer 22 such that the concavities and convexities are in a minute range. For this reason, concavities and convexities in the upper surface of the organic layer formed on the hole transport layer 22, and the cathode 30 are able to be controlled such that the concavities and convexities are in a minute range. Therefore, it is possible to suppress a decrease in luminescent properties due to the concavities and convexities formed in the cathode 30.

Thus, the organic electroluminescence device 100 illustrated in FIG. 1(*a*) is formed.

As illustrated in FIG. 2, the formed organic electroluminescence device 100, for example, is sealed by the sealing case 40. In this embodiment, the organic electroluminescence device 100, for example, is sealed by the sealing case 40 in a glove box of an inert gas atmosphere such as nitrogen gas. At this time, in the sealing case 40, the drying agent 42 may be provided.

Next, an action and an effect of this embodiment will be described.

In this embodiment, the hole transport layer 22 (the organic layer) is formed of the cured resin obtained by the ring opening polymerization of the polymerizable compound (a) containing the ring opening polymerizable group in the presence of the polymerization initiator (b). For this reason, the hole transport layer 22 is able to be formed by using a coating method. Therefore, it is possible to realize the organic electroluminescence device having excellent mass productivity and excellent manufacturing stability.

In contrast, when the hole transport layer 22 is formed by using these components (a) and (b), luminescent properties which are as high as expected may not be obtained. In addition, there is a variation in the luminescent properties.

As a result of intensive studies, the present inventors have found that micro smoothness in the upper surface of the hole transport layer 22 affects luminescent properties.

In a coating method, a solution obtained by dissolving a layer forming material including the polymerizable compound (a) and the polymerization initiator (b) in an organic solvent is applied on the substrate. The solution has low viscosity to the extent of not having a problem in an operation of the coating step, and thus the surface immediately after the coating is smooth. However, a reaction of a resin progresses while drying the organic solvent, and when cross-linkage progresses by heating or the like, minute concavities and convexities occur in the surface of the organic layer. Thus, although a surface of a thin layer formed by a coating method seemingly has sufficient smoothness, minute concavities and convexities of a nm level exist. In the related art, existence of such minute concavities and convexities was not known, and was not seen as a problem. The present inventors have found that such minute concavities and convexities cause a decrease in luminescent properties.

The reason why the minute concavities and convexities formed in the upper surface of the organic layer cause a decrease in luminescent properties is not necessarily clear, but is assumed to be as follows. That is, when the minute concavities and convexities are formed in the upper surface of the organic layer, an electric field strength distribution occurs in a luminescent plane. When luminescence unevenness occurs due to this electric field strength distribution, luminescent properties are degraded. In addition, by the minute concavities and convexities formed in the upper surface of the organic layer, light emitted from the luminescent layer is scattered, and thus luminescent properties are degraded.

In this embodiment, on the basis of such findings, both of the maximum peak height Rp and the maximum valley depth Rv in the upper surface of the hole transport layer 22 (the organic layer) are less than or equal to 14 nm. Accordingly, sufficiently excellent luminescent properties are stably realized.

Thus, according to this embodiment, it is possible to realize the organic electroluminescence device having excellent mass productivity, excellent manufacturing stability, and sufficiently excellent luminescent properties.

Furthermore, the configuration of the organic electroluminescence device 100 according to this embodiment is not limited to the configuration illustrated in FIG. 1(a). For example, as illustrated in FIG. 1(b), the hole injection layer 21 may be disposed between the anode 20 and the hole transport layer 22.

Hereinafter, this embodiment will be described in detail with reference to the examples. Furthermore, this embodiment is not limited to these examples.

EXAMPLE 1

A anode having a thickness of 110 nm which was formed of an Indium-Tin-Oxide (ITO) was formed on a transparent glass substrate. The anode was formed by a vacuum evaporation method.

Next, a hole transport layer was formed on the anode. The hole transport layer was formed by the following method.

First, a first solution including a polymerizable compound (a) indicated by the following formula (8) was prepared. The first solution was obtained by dissolving the polymerizable compound (a) in a xylene solvent under a condition of 160° C. and 10 minutes. Subsequently, the prepared first solution was cooled to room temperature (25° C., hereinafter, unless specified otherwise, "room temperature" indicates 25° C.)

[Chemical Formula 12]

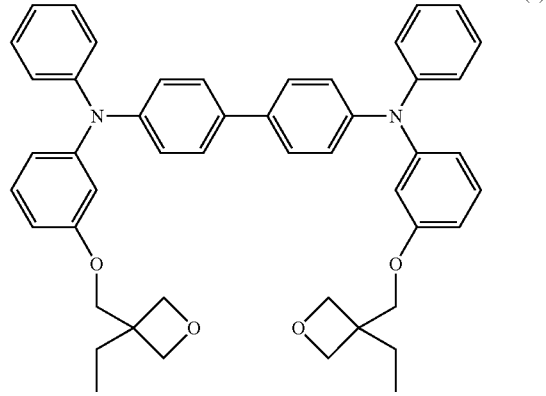

(8)

Subsequently, separately from the first solution, a second solution including a polymerization initiator (b) indicated by the following formula (7) was prepared. The second solution was obtained by dissolving the polymerization initiator (b) in a xylene solvent under a condition of 160° C. and 10 minutes. Subsequently, the prepared second solution was cooled to room temperature.

[Chemical Formula 13]

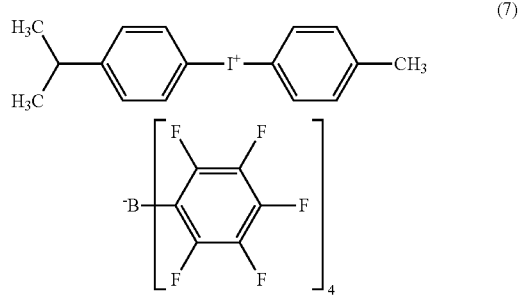

(7)

Subsequently, the first solution and the second solution were mixed, and thus a coating liquid was prepared. The first solution and the second solution were mixed under a room temperature condition. Furthermore, the coating liquid was prepared such that a content of the polymerization initiator (b) in a whole solid content excluding the solvent was 7.6 weight %. Subsequently, the coating liquid was applied on the anode, and thus a coating film having a thickness of 45 nm was formed on the anode. The coating liquid was applied by a spin coating method.

Subsequently, the coating film was dried by using a vacuum dryer at room temperature and under an atmosphere of less than 2 Pa. Subsequently, the coating film was subjected to a heat treatment at 230° C., for 15 minutes, and under normal pressure. Accordingly, in the coating film, a ring opening polymerization of the polymerizable compound (a) progressed in the presence of the polymerization initiator (b), and thus a hole transport layer formed of a resin composition having a three-dimensional cross-linking structure was formed.

Next, a luminescent layer was formed on the hole transport layer by the following method. First, a coating liquid containing bis(2-methyl-8-quinolinolato)(4-phenylphenolato) aluminum as an electron transporting compound and a luminescent material indicated by the following formula (9) was applied on the hole transport layer, and thus a coating film having a thickness of 40 nm was formed on the hole transport layer. The coating liquid was prepared by dissolving the bis(2-methyl-8-quinolinolato)(4-phenylphenolato) aluminum and the luminescent material indicated by the following formula (9) in a toluene solvent. Furthermore, the coating liquid was prepared such that a content of the luminescent material in a whole solid content excluding the solvent was 6 weight %.

[Chemical Formula 14]

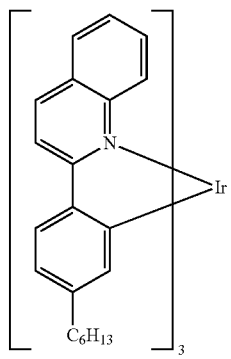

(9)

Subsequently, the coating liquid was applied on the hole transport layer, and thus a coating film having a thickness of 40 nm was formed on the hole transport layer. The coating liquid was applied by a spin coating method.

Subsequently, the coating film was dried by using a vacuum dryer under an atmosphere at a pressure of less than 2 Pa. Subsequently, the coating film formed on the hole transport layer was subjected to a heat treatment. Thus, a luminescent layer was formed.

Next, an electron transport layer having a thickness of 30 nm was formed on the luminescent layer. The electron transport layer was formed by depositing tris(8-quinolinolato) aluminum on the luminescent layer by using a vacuum evaporation method. Next, an electron injection layer having a thickness of 1 nm was formed on the electron transport layer. The electron injection layer was formed by depositing LiF on the electron transport layer by using a vacuum evaporation method. Next, a cathode having a thickness of 80 nm was formed on the electron injection layer. The cathode was formed by depositing Ag on the electron injection layer by using a vacuum evaporation method. Furthermore, steps of forming the electron transport layer, the electron injection layer, and the cathode were sequentially performed in a vacuum deposition machine.

Thus, an organic electroluminescence device including a plurality of organic layers between the anode and the cathode was obtained.

Next, the obtained organic electroluminescence device described above was taken from the vacuum deposition machine. Subsequently, the organic electroluminescence device was sealed by a metal (glass) sealing case. The sealing of the sealing case was performed in a glove box of an inert gas atmosphere. Accordingly, a luminescent device was obtained.

COMPARATIVE EXAMPLE 1

The organic electroluminescence device and the luminescent device were obtained by the same method as that in Example 1 except for a forming method of the hole transport layer. The hole transport layer was formed as follows.

First, the polymerizable compound (a) indicated by the formula (8) described above and the polymerization initiator (b) indicated by the formula (7) described above were put into a xylene solvent. Subsequently, the above-described xylene solvent including the polymerizable compound (a) and the polymerization initiator (b) was heated under a condition of 160° C. and 2 minutes, and thus the polymerizable compound (a) and the polymerization initiator (b) were dissolved in the xylene solvent. Accordingly, the coating liquid including the polymerizable compound (a) and the polymerization initiator (b) was obtained. Furthermore, the coating liquid was prepared such that a content of the polymerization initiator (b) in a whole solid content excluding the solvent was 7.6 weight %.

Subsequently, the coating liquid was applied on the anode, and thus a coating film having a thickness of 45 nm was formed on the anode. The coating liquid was applied by a spin coating method.

Subsequently, the coating film was dried by using a vacuum dryer under an atmosphere at a pressure of less than 2 Pa. Subsequently, the coating film was subjected to a heat treatment at 230° C., for 15 minutes, and under normal pressure. Accordingly, in the coating film, the ring opening polymerization of the polymerizable compound (b) progressed in the presence of the polymerization initiator (b), and thus the hole transport layer formed of the cured resin having a three-dimensional cross-linking structure was formed.

COMPARATIVE EXAMPLE 2

The organic electroluminescence device and the luminescent device were obtained by the same method as that in Comparative Example 1 except for a preparing method of the coating liquid including the polymerizable compound (a) and the polymerization initiator (b). The coating liquid was prepared as follows.

First, the polymerizable compound (a) indicated by the formula (8) described above and the polymerization initiator (b) indicated by the formula (7) described above were put into a xylene solvent. Subsequently, the above-described xylene solvent including the polymerizable compound (a) and the polymerization initiator (b) was heated under a condition of 160° C. and 10 minutes, and thus the polymerizable compound (a) and the polymerization initiator (b) were dissolved in the xylene solvent. Accordingly, the coating liquid including the polymerizable compound (a) and the polymerization initiator (b) was obtained. Furthermore, the coating liquid was prepared such that a content of the polymerization initiator (b) in a whole solid content excluding the solvent was 7.6 weight %.

The examples and each comparative example were evaluated as follows. Evaluation results are shown in Table 1.

(Smoothness of Hole Transport Layer Surface)

A maximum peak height Rp and a maximum valley depth Rv in a surface of the hole transport layer were measured.

The measurement was performed as follows. First, after the hole transport layer was formed, a plurality of locations in a film formed on the glass substrate was cut by a cutter such that a glass substrate surface was exposed. Subsequently, each height from each exposed location in the glass substrate surface to the surface of the hole transport layer which was positioned in the vicinity of each location was measured. On the basis of the measured height from each location described above, a film thickness in a plurality of locations in the film formed on the glass substrate was calculated. Then, from the calculated film thickness, the maximum peak height Rp and the maximum valley depth Rv in the surface of the hole transport layer were obtained. The height from the exposed surface of the glass substrate to the surface of the hole transport layer which was positioned in the vicinity thereof was measured by using Alpha Step IQ (manufactured by KLA-Tencor Corporation) under conditions where a needle pressure was 3.0±0.2 mg, a scan range was 300 μm, and the number of times of scanning was 1 time.

Furthermore, in Table 1, a greater one of the maximum peak height Rp or the maximum valley depth Rv in the measure range is shown. Units of measurement values shown in Table 1 are nm.

(Smoothness of Cathode Surface)

A maximum peak height Rp and a maximum valley depth Rv in a surface of the cathode were measured.

The measurement was performed as follows. First, after the cathode was formed, a plurality of locations in a film formed on the glass substrate was cut by a cutter such that a glass substrate surface was exposed. Subsequently, each height from each exposed location in the glass substrate surface to the surface of the cathode which was positioned in the vicinity of each location was measured. On the basis of the measured height from each portion described above, a film thickness in a plurality of locations in the film formed on the glass substrate was calculated. Then, from the calculated film thickness, the maximum peak height Rp and the maximum valley depth Rv in the surface of the cathode were obtained. The height from the exposed surface of the glass substrate to the surface of the cathode which was positioned in the vicinity thereof was measured by using Alpha Step IQ (manufactured by KLA-Tencor Corporation) under a condition where a needle pressure was 3.0±0.2 mg, a scan range was 300 μm, and the number of times of scanning was 1 time.

Furthermore, in Table 1, a greater one of the maximum peak height Rp or the maximum valley depth Rv in the measure range is shown. Units of measurement values shown in Table 1 are nm.

(Relative Luminance)

A relative luminance of the obtained luminescent device was measured. A luminance of the luminescent device in each example and each comparative example was calculated by current-voltage-luminance measurement using a luminance meter (LS-110, manufactured by Konica Minolta Inc.) and current power supply (236 type Source-Measure-Unit, manufactured by Keithley Instruments). In Table 1, a relative luminance in each example and each comparative example when the luminance in Example 1 was set to a standard (100%) is shown.

(Relative Life Duration)

A relative life duration of the obtained luminescent device was measured. The relative life duration was calculated from a change in relative luminance under a constant current density of approximately 20 mA/cm$^2$. In Table 1, a relative life duration in each example and each comparative example when a life duration in Example 1 was set to a standard (100%) is shown.

(Luminescence Unevenness)

Presence or absence of luminescence unevenness was observed by optical microscopic observation using an Eclipse L150 (manufactured by Nikon Corporation) while allowing the obtained organic electroluminescence device to emit light. An input voltage was 3 V to 4 V at which the organic electroluminescence device emits light.

TABLE 1

| | Example 1 | Comparative Example 1 | Comparative Example 2 |
|---|---|---|---|
| Smoothness of Hole Transport Layer Surface | 4 nm | 15 nm | Greater than or Equal to 30 nm |
| Smoothness of Cathode Surface | 5 nm | 11 nm | Greater than or Equal to 30 nm |
| Relative Luminance | 100% | 100% | 90% |
| Relative Life Duration | 100% | 100% | 90% |
| Luminescence Unevenness | Even | Uneven | Uneven |

As shown in Table 1, in Example 1, the maximum peak height Rp and the maximum valley depth Rv in a hole transport layer surface were less than or equal to 14 nm. In addition, the maximum peak height Rp and the maximum valley depth Rv in a cathode surface were less than or equal to 10 nm. In Example 1, all of the relative luminance, the relative life duration, and the luminescence unevenness were excellent.

In contrast, in Comparative Example 1, the maximum peak height Rp and the maximum valley depth Rv in the hole transport layer surface exceeded 14 nm. In addition, the maximum peak height Rp and the maximum valley depth Rv in the cathode surface exceeded 10 nm. In Comparative Example 1, luminescence unevenness occurred as compared to Example 1. That is, luminescent properties were degraded.

In addition, in Comparative Example 2, the maximum peak height Rp and the maximum valley depth Rv in the hole transport layer surface exceeded 14 nm. In addition, the maximum peak height Rp and the maximum valley depth Rv in the cathode surface exceeded 10 nm. In Comparative Example 2, luminescent efficiency was degraded and luminescence unevenness occurred as compared to Example 1. That is, luminescent properties were degraded.

The invention claimed is:

1. A manufacturing method of an organic electroluminescence device, comprising:

a step of forming an organic layer on a anode;

a step of forming a luminescent layer on the organic layer; and a step of forming a cathode on the luminescent layer, wherein the step of forming the organic layer includes a step of preparing a first solution including a polymerizable compound (a) which contains a ring opening polymerizable group, and a second solution including a polymerization initiator (b), a step of preparing a coating liquid by mixing the first solution with the second solution, a step of forming a coating film by applying the coating liquid, and a step of curing the coating film by a ring opening polymerization of the polymerizable compound (a) in the presence of the polymerization initiator (b).

2. The manufacturing method of an organic electroluminescence device according to claim 1, wherein in the step of preparing the first solution and the second solution, the first solution is prepared by dissolving the polymerizable compound (a) in a first solvent under a temperature condition less than or equal to (a boiling point of the first solvent +30° C.), and the second solution is prepared by dissolving the polymerization initiator (b) in a second solvent under a temperature condition less than or equal to (a boiling point of the second solvent +30° C.).

3. The manufacturing method of an organic electroluminescence device according to claim 2, wherein the step of curing the coating film includes a step of curing the coating film by performing a heat treatment, and does not include a step of curing the coating film by performing light irradiation.

4. The manufacturing method of an organic electroluminescence device according to claim 2, wherein in the step of curing the coating film, the coating film is subjected to a heat treatment with a condition of a time of greater than or equal to 5 minutes and less than or equal to 60 minutes.

5. The manufacturing method of an organic electroluminescence device according to claim 2, further comprising:

a step of cooling the first solution and the second solution after the step of preparing the first solution and the second solution and before the step of preparing the coating liquid by mixing the first solution with the second solution.

* * * * *